(12) United States Patent
Ono et al.

(10) Patent No.: US 8,330,177 B2
(45) Date of Patent: Dec. 11, 2012

(54) DISPLAY DEVICE

(75) Inventors: Masayuki Ono, Osaka (JP); Shogo Nasu, Hyogo (JP); Toshiyuki Aoyama, Osaka (JP); Eiichi Satoh, Osaka (JP); Reiko Taniguchi, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 544 days.

(21) Appl. No.: 12/528,244

(22) PCT Filed: Feb. 22, 2008

(86) PCT No.: PCT/JP2008/000300
§ 371 (c)(1),
(2), (4) Date: Aug. 21, 2009

(87) PCT Pub. No.: WO2008/105153
PCT Pub. Date: Sep. 4, 2008

(65) Prior Publication Data
US 2010/0102343 A1    Apr. 29, 2010

(30) Foreign Application Priority Data
Feb. 27, 2007 (JP) ................................ 2007-046979

(51) Int. Cl.
*H01L 33/00* (2010.01)
(52) U.S. Cl. .................. 257/98; 257/E33.001
(58) Field of Classification Search .......... 257/79, 257/88, 98–100, 103, E33.001
See application file for complete search history.

(56) References Cited

U.S. PATENT DOCUMENTS

| | | | |
|---|---|---|---|
| 5,432,015 A | 7/1995 | Wu et al. | |
| 6,380,672 B1 | 4/2002 | Yudasaka | |
| 6,952,023 B2 | 10/2005 | Yamazaki et al. | |
| 7,427,422 B2 * | 9/2008 | Wu et al. | 427/66 |
| 2003/0025166 A1 | 2/2003 | Yamazaki et al. | |
| 2004/0222429 A1 | 11/2004 | Yamazaki et al. | |
| 2005/0140286 A1 | 6/2005 | Ito et al. | |

(Continued)

FOREIGN PATENT DOCUMENTS
JP    62-254394    11/1987
(Continued)

OTHER PUBLICATIONS

K. Katayama et al., "ZnSe-based white LEDs," Journal of Crystal Growth 214/215, 2000, pp. 1064-1070.

*Primary Examiner* — (Vikki) Hoa B Trinh
(74) *Attorney, Agent, or Firm* — McDermott Will & Emery LLP

(57) ABSTRACT

A display device is provided with a pair of a first electrode and a second electrode, at least one electrode of the first and second electrodes being transparent or translucent and a phosphor layer provided as being sandwiched between the first electrode and the second electrode, and at least one buffer layer provided as being sandwiched between the first or second electrode and the phosphor layer, and the phosphor layer has a plurality of pixel regions that are selectively allowed to emit light in a predetermined range thereof and non-pixel regions that divide at least one portion of the pixel regions, and wherein the buffer layer is sandwiched between the first or second electrode and the phosphor layer so that the size of an electric potential barrier between the first or second electrode and the phosphor layer via the buffer layer is made smaller than the size of a Schottky barrier between the first or second electrode and the phosphor layer that are directly made contact with each other without the buffer layer therebetween.

13 Claims, 20 Drawing Sheets

U.S. PATENT DOCUMENTS

| | | |
|---|---|---|
| 2005/0179368 A1 | 8/2005 | Ryu et al. |
| 2005/0264175 A1 | 12/2005 | Yamazaki et al. |
| 2006/0091789 A1 | 5/2006 | Aoyama et al. |
| 2007/0181890 A1 | 8/2007 | Yamazaki et al. |
| 2008/0035916 A1 | 2/2008 | Seo et al. |

FOREIGN PATENT DOCUMENTS

| | | |
|---|---|---|
| JP | 7-050197 | 2/1995 |
| JP | 9-320760 | 12/1997 |
| JP | 2004-177972 | 6/2004 |
| JP | 2005-158374 | 6/2005 |
| JP | 2005-209651 | 8/2005 |
| JP | 2005-294415 | 10/2005 |
| JP | 2006-127884 | 5/2006 |
| JP | 2006-191127 | 7/2006 |
| JP | 2006-210902 | 8/2006 |
| JP | 2008-091754 | 4/2008 |
| JP | 2008-091755 | 4/2008 |

* cited by examiner

DISPLAY DEVICE

RELATED APPLICATIONS

This application is the U.S. National Phase under 35 U.S.C. §371 of International Application No. PCT/JP2008/000300, filed on Feb. 22, 2008, which in turn claims the benefit of Japanese Application No. 2007-046979, filed on Feb. 27, 2007, the disclosures of which Applications are incorporated by reference herein.

BACKGROUND OF THE INVENTION

1. Technical Field

This present invention relates to a display device that uses electroluminescent elements (hereinafter, referred to simply as EL).

2. Background Art

Although a conventional semiconductor light-emitting element is operated at a low voltage with high luminance, it forms a spot light source, and it is consequently difficult to use this as a surface light source. Moreover, upon manufacturing a light-emitting element, an expensive substrate is required to cause one of reasons for high costs. Moreover, with a thin-film light-emitting element, a Schottky barrier tends to occur on a jointed face between the phosphor layer and an electrode to cause a problem of disturbance in carrier injection.

FIG. 36 is a schematic block diagram that shows a structure of a conventional light-emitting element 50. A phosphor layer 53 is allowed to have a recombination-type phosphor layer structure so that the phosphor layer 53 has a two-layer structure including an n-type semiconductor layer 53a and a p-type semiconductor layer 53b. A transparent electrode 52 to form an electron-injecting electrode and a back electrode 54 to form a hole-injecting electrode are electrically connected to each other with a DC power supply 55 interposed therebetween. When power is supplied from the DC power supply 55, an electric potential difference occurs between the transparent electrode 52 and the back electrode 54 so that a voltage is applied to the phosphor layers 53a and 53b. Then, the phosphor layers 53a and 53b, placed between the transparent electrode 52 and the back electrode 54, are allowed to emit light, and the light is transmitted through the transparent electrode 52, and is taken out of the light-emitting element 50.

In this case, depending on a combination of the semiconductor and the electrode, a Schottky barrier occurs on the joined face thereof to cause a reduction in the efficiency of injecting electrons and holes to the phosphor layers 53a and 53b, resulting in a problem of difficulty in improving the efficiency. Referring to energy band charts in FIGS. 37A and 37B as well as in FIGS. 38A and 38B, the following description will discuss the problem of the Schottky barrier on this joined surface.

FIGS. 37A and 37B are energy band charts that show states before and after a contact between the n-type semiconductor layer 53a and the transparent electrode 52. As shown in FIG. 37A, before the contact, respectively different Fermi levels are exerted relative to the vacuum level; however, when the semiconductor and the electrode are made in contact with each other, as shown in FIG. 37B, the band of the n-type semiconductor layer 53a is curved on the contact surface so as to allow the respective Fermi levels to be made coincident with each other, with the result that a great Schottky barrier is caused between the n-type semiconductor layer 53a and the transparent electrode 52. As a result, the injection efficiency of electrons from the transparent electrode 52 to the n-type semiconductor layer 53a is lowered. For example, a metal oxide, such as ITO, is used as the transparent electrode 52; however, since, in general, the work function of this material is comparatively large, that is, from 4 to 5 eV, a large Schottky barrier is generated between the n-type semiconductor layer 53a and the transparent electrode 52.

Moreover, FIGS. 38A and 38B are energy band charts that show states before and after a contact between the p-type semiconductor layer 53b and the back electrode 54. In the same manner as with the n-type semiconductor layer 53a, with the p-type semiconductor layer 53b also, when the semiconductor and the electrode are made in contact with each other, the band of the p-type semiconductor layer 53b is curved on the contact surface so as to allow the respective Fermi levels to be made coincident with each other, with the result that, as shown in FIG. 38B, a great Schottky barrier is caused between the p-type semiconductor layer 53b and the back electrode 54; consequently, the injection efficiency of holes from the back electrode 54 to the p-type semiconductor layer 53b is lowered.

In order to solve the above-mentioned problems, in general, the following methods have been used.
(1) A material having a large work function is used for the hole injecting electrode, while a material having a small work function is used for the electron injecting electrode.
(2) A layer doped with a high density is formed on the interface between the electrode and the semiconductor, as shown in Japanese Patent Laid-open Publication No. 2005-294415.
(3) A Schottky barrier is made smaller by using an alloying reaction between the electrode material and the semiconductor, as shown in J. Crystal Growth 214/215, p 1064 (2000).

In the case of, for example, method (1), however, when a substance having, in particular, a small work function is used as the electrode, a problem arises in which, since, in general, a substance having a small work function is poor in stability in the air, it is not possible to put the substance into practical use. Moreover, in the cases of methods (2) and (3), it is quite possible that, each time the material or composition of the semiconductor serving as the phosphor layer is changed, revisions of the processing conditions are required.

As a result of extensive studies made by the inventors of the present invention to achieve a low voltage and high luminance of the inorganic EL element, and the inventors have found an inorganic EL element that can solve the above-mentioned problem, and can be driven by using a direct current and emit light with high luminance by using a low voltage of several 10V that is sufficiently low in comparison with the voltage required for the conventional inorganic EL element (hereinafter, referred to as "direct-current driving type inorganic EL element").

SUMMARY OF THE INVENTION

The direct-current driving type inorganic EL element uses a phosphor layer that has a resistance value in the semiconductor region that is lower by several digits in resistivity than that of a phosphor layer used for the conventional light emitting element. In a case where this EL element is applied to a display device of a simple matrix structure, even if a light emission threshold-value voltage is applied to a scanning electrode $X_i$ and a data electrode $Y_j$ in order to allow only the specific pixel (supposing that this is indicated by $C_{i,j}$) to emit light, a leakage current flows between a scanning electrode $X_{i+1}$ and a data electrode $Y_j$ that form a peripheral pixel (for example, $C_{i+1,j}$), to sometimes cause an erroneous light emission (hereinafter, this phenomenon is referred to as "crosstalk"). In this manner, in contrast to the effect of high luminance, new problems arise in the direct-current driving-type inorganic EL element to be solved upon being put into practical use.

The following display device of a simple matrix type that utilizes organic EL elements using an organic material as its illuminant is exemplified as a device having similar problems described above. In accordance with the technique described in Japanese Patent Laid-open Publication No. 9-320760, a method has been proposed in which, in an organic thin-film EL element, in order to prevent a leakage current in the organic thin-film layer upon emitting light, by applying an excimer laser to the respective layers that have been film-formed from the surface layer side, one or a plurality of electrode layers or organic thin-film layers are patterned so that crosstalk in the matrix-shaped organic thin-film EL element is prevented. In accordance with the technique described in Japanese Patent Laid-open Publication No. 7-50197, although its direct objective is different, a method similar to the method described above has been proposed in which, in a conventional inorganic EL element, by applying a laser beam having a desired wavelength focused from the surface layer side to the respective layers that have been film-formed, one portion of the lower dielectric layer is directly removed, while the phosphor layer, the upper dielectric layer and the transparent electrode, stacked on the upper side of the lower dielectric layer are indirectly removed. In this method, upon forming a stripe-shaped fine pattern of the transparent electrode, the phosphor layer is also simultaneously patterned.

An objective of the present invention is to provide a display device that uses a light-emitting element that can be driven at a low voltage, and has high luminance and high efficiency so that it becomes possible to prevent crosstalk and achieve high display quality.

A display device includes:

a pair of a first electrode and a second electrode, at least one electrode of the first second electrodes being transparent or translucent;

a phosphor layer provided as being sandwiched between the first electrode and the second electrode; and at least one buffer layer provided as being sandwiched between the first electrode or the second electrode and the phosphor layer, wherein the phosphor layer has a plurality of pixel regions that are selectively allowed to emit light in a predetermined range thereof and non-pixel regions that divide at least one portion of the pixel regions, and wherein the buffer layer is sandwiched between the first or second electrode and the buffer layer so that the size of an electric potential barrier between the first or second electrode and the phosphor layer via the buffer layer is made smaller than the size of a Schottky barrier between the first or second electrode and the phosphor layer that are directly made contact with each other without the buffer layer therebetween.

Moreover, the pixel regions and the non-pixel regions may periodically distributed over the same plane of the phosphor layer, with the pixel regions being divided by the non-pixel regions.

Further, the non-pixel regions may be provided to divide the pixel regions into a stripe shape.

Furthermore, the non-pixel regions may include discontinuous regions of the phosphor layer forming the pixel regions.

Moreover, the non-pixel regions may include one portion of the first electrode or the second electrode that divides at least one portion of the phosphor layer forming the pixel regions.

Further, the non-pixel regions are made of regions having higher resistance than that of the pixel regions.

Furthermore, each of the non-pixel regions include a void region that is in a vacuum state or filled with a nonvolatile gas.

Moreover, the non-pixel regions may include solid-state regions mainly including an insulating resin.

Further, the phosphor layer contains one or more elements selected from the group consisting of Ag, Cu, Ga, Mn, Al and In, and the non-pixel regions have a content density of the element that is different from that of the pixel regions.

Furthermore, the phosphor layer may be made of a compound semiconductor.

Moreover, the non-pixel regions may be formed by amorphous phase.

Further, the pixel regions may be formed by crystalline phase of the material forming the phosphor layer, and the non-pixel regions are formed by amorphous phase of the material forming the phosphor layer.

Furthermore, a DC voltage may be applied between the first electrode and the second electrode so as to emit light, and either one of the first electrode and the second electrode functions as an electron-injecting electrode, while the other electrode functions as a hole-injecting electrode.

In this case, the buffer layer may be provided with two buffer layers including:

a first buffer layer formed between the electron-injecting electrode and the phosphor layer, and a second buffer layer formed between the hole-injecting electrode and the phosphor layer.

Alternatively, the buffer layer is provided with at least one of buffer layers including:

a first buffer layer formed between the electron-injecting electrode and the phosphor layer, and a second buffer layer formed between the hole-injecting electrode and the phosphor layer.

Moreover, the first buffer layer may contain a substance having a work function of 3.5 eV or less.

Further, the second buffer layer may contain a substance having a work function of 5.0 eV or more.

Furthermore, the first buffer layer may contain an alkali metal oxide.

Moreover, the first buffer layer may be made of a substance having an electro-negativity of about 3 or more.

Further, the phosphor layer may be a two-layer-type phosphor layer in which an n-type semiconductor layer and a p-type semiconductor layer are stacked. Furthermore, the phosphor layer may be a three-layer-type phosphor layer including an n-type semiconductor layer and a p-type semiconductor layer with a non-dope semiconductor layer being sandwiched therebetween.

Moreover, the display device according to the present invention includes a color conversion layer provided as being parallel to the first electrode and the second electrode, and the color conversion layer placed in front the phosphor layer in a light emission taking-out direction. The display device according to the present invention may include: a supporting substrate that faces at least one of the electrodes and supports the electrodes.

A method for manufacturing a display device according to the present invention, the display device including a substrate, a first electrode on the substrate, a first buffer layer on the first electrode, a phosphor layer on the first buffer layer, and a second electrode that is transparent or translucent on the phosphor layer, the method including:

providing a substrate;

forming a first electrode on the substrate;

forming a first buffer layer on the first electrode so that the size of an electric potential barrier between the first electrode and the phosphor layer via the buffer layer is made smaller than the size of a Schottky barrier between the first electrode and the phosphor layer that are directly made contact with each other without the buffer layer;

forming a phosphor layer on the first buffer layer;

defining crystalline pixel regions and amorphous non-pixel regions in a divided manner by carrying out a laser annealing process on one portion of the phosphor layer; and forming a second electrode that is transparent or translucent on the phosphor layer.

In accordance with the present invention, it is possible to provide a display device that uses a light-emitting element that can be driven at a low voltage, and has high luminance and high efficiency, the display device making it possible to prevent crosstalk and consequently to achieve high display quality.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
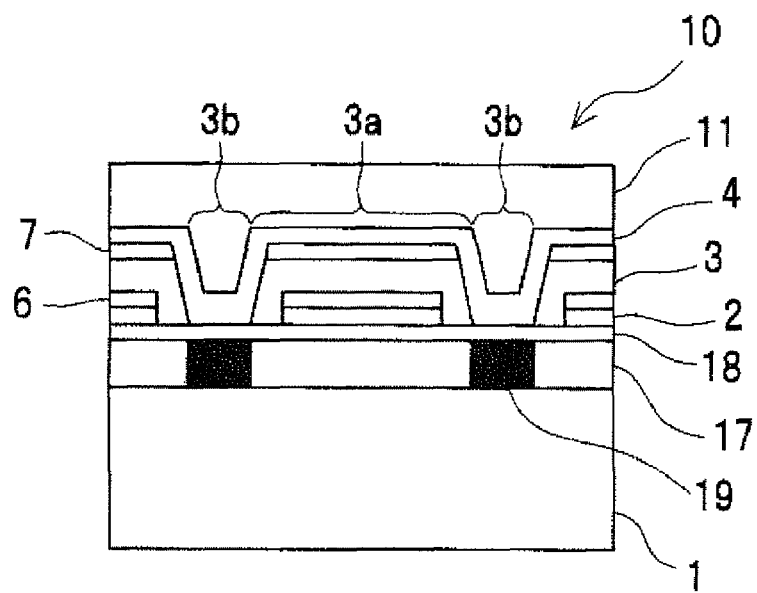
FIG. 1 is a schematic cross-sectional view that shows a structure of a display device in accordance with first embodiment of the present invention.

Referring to attached drawings, the following description will discuss a display device in accordance with embodiments of the present invention. In the drawings, those members that are virtually the same are indicated by the same reference numerals.

First Embodiment

<Schematic Structure of Display Device>

FIG. 1 is a schematic cross-sectional view that shows a display device 10 in accordance with first embodiment of the present invention. In this display device 10, a phosphor layer 3 containing an illuminant is formed between a transparent electrode 2 acting as a first electrode and a back electrode 4 acting as a second electrode. Moreover, a first buffer layer 6 is sandwiched between the transparent electrode 2 and the phosphor layer 3, and a second buffer layer 7 is sandwiched between the back electrode 4 and the phosphor layer 3. A transparent substrate 1, which supports these electrodes, is formed adjacent to the transparent electrode 2. The transparent electrode 2 and the back electrode 4 are electrically connected to each other with a power supply 5 interposed therebetween. When power is supplied from the power supply 5, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2 and the transparent substrate 1, and is taken out from the display device 10. In the present embodiment, a DC power supply is used as the power supply 5.

Figure 2:
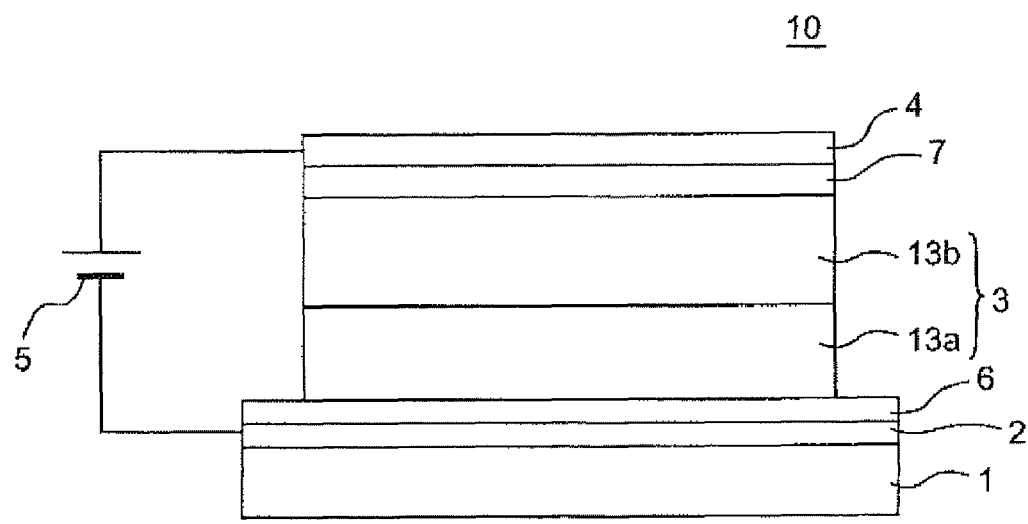
FIG. 2 is a schematic cross-sectional view that shows a cross-sectional structure perpendicular to a light-emitting face of one pixel of the display device of FIG. 1.

FIG. 2 is a schematic cross-sectional view that shows a cross-sectional structure of one pixel of the display device 10. This display device 10 can be defined to have a structure in which each pixel acts as one light-emitting element (EL element), and each light-emitting element is configured by successively stacking a transparent electrode 2, a first buffer layer 6, a phosphor layer 3, a second buffer layer 7 and a back electrode 4 on a substrate 1 in this order. The transparent electrode 2 and the back electrode 4 are electrically connected to each other with a DC power supply 5 interposed therebetween. In this case, the transparent electrode 2, connected to the negative pole side, functions as an electron-injecting electrode (first electrode), and the back electrode 4, connected to the positive pole side, functions as a hole-injecting electrode (second electrode). In this light-emitting element, the phosphor layer 3 has a two-layer structure in which an n-type semiconductor layer 13a and a p-type semiconductor layer 13b are stacked, and the electron-injecting electrode is placed on the n-type semiconductor layer 13a side and the hole-injecting electrode is placed on the p-type semiconductor layer 13b side.

Moreover, the display device 10 is characterized in that a first buffer layer 6 is placed between the transparent electrode 2 acting as the electron-injecting electrode (first electrode) and the n-type semiconductor 13a, while a second buffer layer 7 is placed between the p-type semiconductor layer 13b and the back electrode 4 acting as the hole-injecting electrode (second electrode). In this manner, by respectively inserting the first and second buffer layers 6 and 7 between the semiconductor layers 13a, 13b and the electrodes 2, 4 that form the phosphor layer 3, the height of Schottky barriers between the transparent electrode 2 and the n-type semiconductor layer 13a and the height of Schottky barriers between the back electrode 4 and the p-type semiconductor layer 13b can be made smaller respectively, as shown in energy band charts of FIGS. 3 and 4. With this arrangement, the injecting efficiency of electrons and holes to the phosphor layer 3 can be enhanced. Additionally, the function for reducing Schottky barriers on the joined face, obtained by forming the first and second buffer layers 6 and 7, will be described later.

Moreover, in the display device 10, a plurality of pixel regions 3a that are selectively allowed to emit light are disposed two-dimensionally in the phosphor layer 3. Each of the pixel regions 3a is selected by a combination of the transparent electrode 2 and the back electrode 4, and allowed to emit light. The respective pixel regions 3a are divided by non-pixel regions 3b. These non-pixel regions 3b are formed by discontinuous portions of the phosphor layer 3. On one portion of the discontinuous portions of this interpixel region, the back electrode 4 is provided to surround the pixel region 3a. Moreover, the display device 10 is further provided with a color filter 17 between the transparent electrode 2 and the transparent substrate 1. This color filter 17 is provided with a black matrix 19 located in a region between adjacent pixels, and the region, surrounded by the black matrix 19, that corresponds to the pixel selectively transmits light emission from the phosphor layer 3 for each of the colors of RGB.

In this display device 10, the transparent electrode 2 and the back electrode 4 are electrically connected to each other with a DC power supply 5 interposed therebetween. When power is supplied from the DC power supply 5, a potential difference is caused between the transparent electrode 2 and the back electrode 4 so that a voltage is applied to the phosphor layer 3. Thus, the phosphor layer 3, disposed between the transparent electrode 2 and the back electrode 4, is allowed to emit light, and the light is allowed to transmit the transparent electrode 2, and is taken out of the light-emitting elements forming the respective pixels, that is, out of the display device 10.

Not limited to the above-mentioned structure, the phosphor layer 3 may be formed into a three-layer structure of a p-i-n type. The p-i-n type structure refers to a structure in which an intrinsic semiconductor layer is inserted between the p-type semiconductor and the n-type semiconductor. Moreover, various modifications may be made, for example, in such manners so as to form the phosphor layer 3 into a single-layer structure, to provide a plurality of pn-joined films, to stack a plurality of p-i-n-type layers, to provide a plurality of thin dielectric layers between the electrode and the phosphor layer in order to limit an electric current, to drive the device by using an AC power supply, to make the back electrode transparent, to prepare the back electrode as a black electrode, to further provide a structure that seals one portion or the entire portion of the display device 10 and to further provide a structure for color-converting the light emission color from the phosphor layer 3 in front of a light-emission taking-out direction. For example, by combining a blue-color phosphor layer and a color-conversion layer for converting the blue color into a green color or a red color, a white-color display device may be formed.

The following description will discuss the respective components of this display device 10.

<Substrate>

A material that can support respective layers formed thereon, and also has a high electric insulating property is used as the transparent substrate 1. Moreover, the material needs to have a light transmitting property to a light wavelength that is emitted from the phosphor layer 3. Examples of the material include glass, such as corning 1737, quartz, ceramics and the like. In order to prevent alkaline ion or the like, contained in normal glass, from giving adverse effects to the light-emitting device, non-alkaline glass, or soda lime glass, formed by coating alumina or the like as an ion barrier layer on the glass surface, may be used. However, these materials are exemplary only, and the material of the transparent substrate 1 is not particularly limited by these. Moreover, with a structure in which no light is taken out from the substrate side, the above-mentioned light transmitting property is not required, and a material having no light transmitting property may also be used. Examples of the material include a metal substrate, a ceramic substrate, a silicon wafer and the like with an insulating layer being formed on the surface thereof.

<Electrode>

Any material may be used as the transparent electrode 2 on the side from which light is taken out as long as it has a light-transmitting property so as to take light emission generated in the phosphor layer 3 out of the layer, and in particular, those materials having a high transmittance within a visible light range are desirably used. Moreover, those materials that exert low resistance are preferably used, and in particular, those materials having a superior adhesive property to a protective layer 18 and the phosphor layer 3 are desirably used. In particular, preferable examples of materials for the transparent electrode 2 include those ITO materials ($In_2O_3$ doped with $SnO_2$, referred to also as indium tin oxide), metal oxides mainly including InZnO, ZnO, $SnO_2$ or the like, metal thin films such as Pt, Au, Pd, Ag, Ni, Cu, Al, Ru, Rh, and Ir, or conductive polymers, such as polyaniline, polypyrrole, PEDOT/PSS and polythiophene; however, the material is not particularly limited by these.

For example, the ITO material may be formed into a film by using a film-forming method, such as a sputtering method, an electron beam vapor deposition method and an ion plating method so as to improve the transparency thereof or to lower the resistivity thereof. Moreover, after the film-forming process, the film may be surface-treated by a plasma treatment or the like so as to control the resistivity thereof. The film thickness of the transparent electrode 2 is determined based upon the sheet resistance value and visible light transmittance to be required.

Moreover, any of generally well-known conductive materials may be applied as the back electrode 4 on the side from which no light is taken out. Preferable examples thereof include metal oxides, such as ITO, InZnO, ZnO and $SnO_2$, metals, such as Pt, Au, Pd, Ag, Ni, Cu, Al, Ru, Rh and Ir, or conductive polymers, such as polyaniline, polypyrrole and PEDOT [poly(3,4-ethylenedioxythiophene)]/PSS (polystyrene sulfonate), or conductive carbon.

The transparent electrode 2 and the back electrode 4 may have a structure in which a plurality of electrodes are formed into a striped pattern within the layer. Moreover, both of the transparent electrodes 2 (first electrodes) and the back electrodes 4 (second electrodes) may be formed into a plurality of stripe-shaped electrodes with the respective striped-shaped electrodes of the first electrodes 2 and all the stripe-shaped electrodes of the second electrodes 4 being set to a twisted positional relationship, and with projected shapes onto the light-emitting face of the respective stripe-shaped electrodes of the first electrodes 2 and projected shapes onto the light emitting face of all the stripe-shaped electrodes of the second electrodes 4 being made to intersect with one another. In this case, it is possible to obtain a display in which, by applying a voltage to electrodes respectively selected from the stripe-shaped electrodes of the first electrodes and the stripe-shaped electrodes of the second electrodes, a predetermined position is allowed to emit light.

<Phosphor Layer>

The following description will discuss the phosphor layer 3. The phosphor layer 3 is a two-layer-type phosphor layer in which an n-type semiconductor layer 13a and a p-type semiconductor layer 13b are stacked.

The material for the n-type semiconductor layer 13a is prepared as an n-type semiconductor material that has majority carriers being electrons, and exhibits an n-type conductivity. As the material, those materials having a band gap size ranging from a near ultraviolet area to a visible light area (from 1.7 eV to 3.6 eV) in the optical band gap are preferably used, and those materials having a band gap size ranging from the near ultraviolet area to a blue color area (from 2.6 eV to 3.6 eV) are more preferably used. Specific examples thereof include: the aforementioned compounds between Group 12 to Group 16 elements, such as the aforementioned ZnS, ZnSe, ZnTe, CdS and CdSe, and mixed crystals of these (for example, ZnSSe or the like), compounds between Group II to Group 16 elements, such as CaS and SrS, and mixed crystals of these (for example, CaSSe or the like), compounds between Group 13 to Group 15 elements, such as AlP, GaAs, GaN and GaP, and mixed crystals of these (for example, InGaN or the like), and mixed crystals of the above-mentioned compounds, such as ZnMgS, CaSSe and CaSrS. Moreover, chalcopyrite-type compounds, such as $CuAlS_2$, may be used. Furthermore, one or a plurality of kinds of atoms or ions, selected from the group consisting of the following elements, may be contained as additives: Cu, Ag, Au, Al, Ga, In, Mn, Cl, Br, I, Li, Ce, Pr, Nd, Pm, Sm, Eu, Gd, Tb, Dy, Ho, Er, Tm and Yb. The light emission color from the phosphor layer 3 is also determined by the kinds of these elements.

On the other hand, the material for the p-type semiconductor layer 13b is prepared as a p-type semiconductor material that has majority carriers being holes, and exhibits a p-type conductivity. Examples of the p-type semiconductor material include compounds, such as $Cu_2S$, ZnS, ZnSe, ZnSSe, ZnSeTe and ZnTe. Among these p-type semiconductor materials, although $Cu_2S$ or the like inherently exhibits a p-type conductivity, the other materials are used by adding thereto one kind or more of elements selected from the group consisting of nitrogen, Ag, Cu and In. Moreover, chalcopyrite-type compounds that exert the p-type conductivity, such as $CuGaS_2$ and $CuAlS_2$, may be used. Furthermore, nitrides, such as GaN and InGaN, containing Zn, Mg or the like as an additive may be used.

<Buffer Layer>

Figure 3:
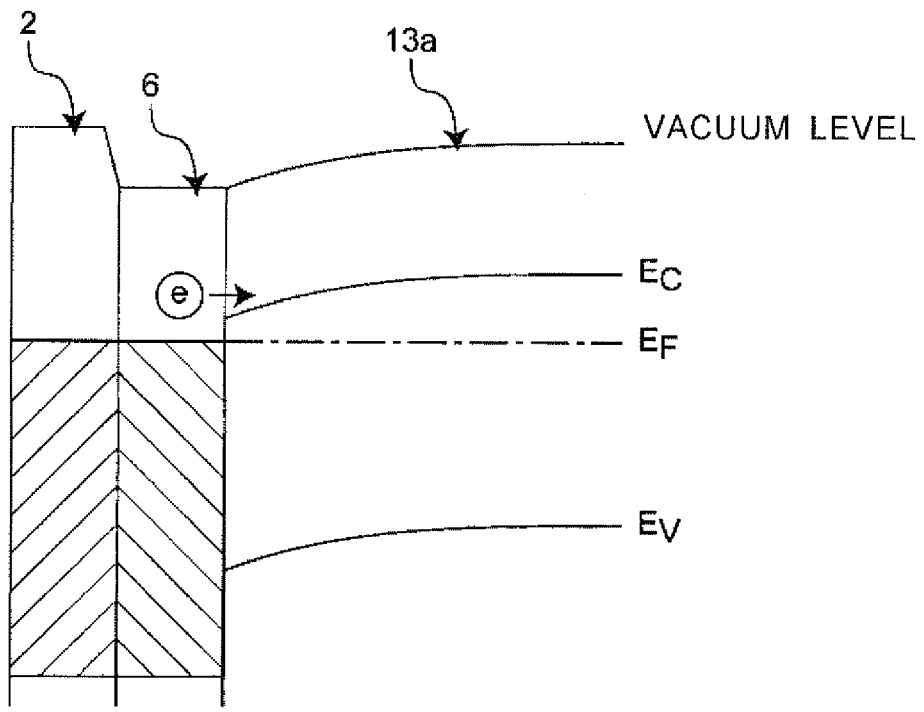
FIG. 3 is an energy band chart between a first electrode serving as an electron-injecting electrode and an n-type semiconductor layer.

The first buffer layer 6 is formed between the first electrode 2 serving as an electron-injecting electrode and the n-type semiconductor layer 13a. As the first buffer layer 6, a substance having such a small work function as to form an ohmic junction with the n-type semiconductor layer 13a, in particular, a substance having a work function of 3.5 eV or less is preferably selected. In this case, as shown in FIG. 3, Schottky barriers between the first electrode (transparent electrode) 2 serving as an electron-injecting electrode and the n-type semiconductor layer 13a become smaller so that the electron injection from the first electrode 2 is efficiently carried out. The composition of the first buffer layer 6 is preferably made of one or more materials selected from the group consisting of Al, Li, Al—Li and the like.

Figure 4:
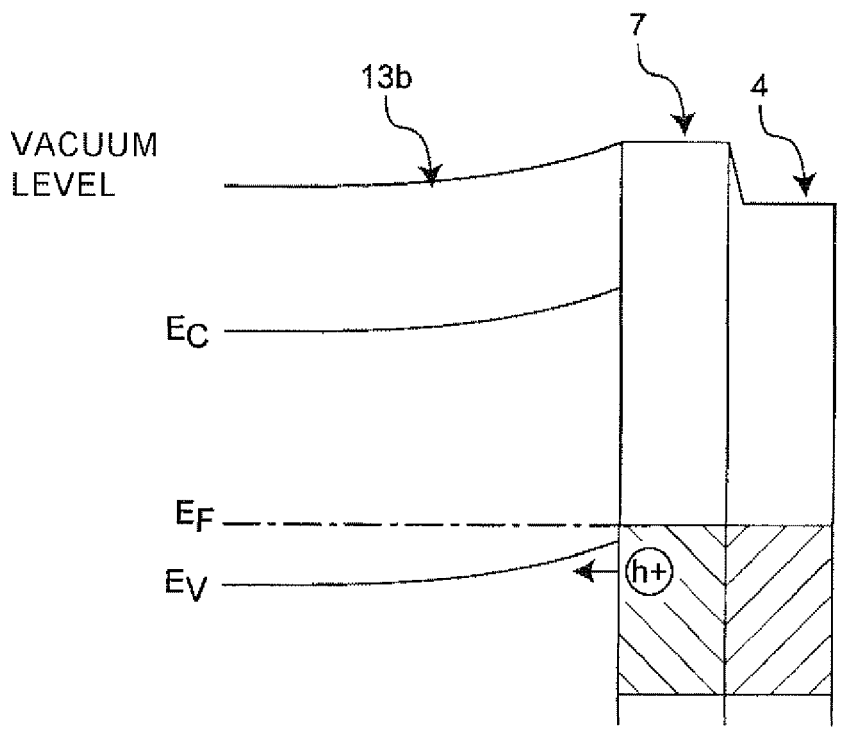
FIG. 4 is an energy band chart between a second electrode serving as a hole-injecting electrode and a p-type semiconductor layer.

Moreover, the second buffer layer 7 is formed between the second electrode 4 serving as a hole-injecting electrode and the p-type semiconductor layer 13b. As the second buffer layer 7, a substance having such a great work function as to form an ohmic junction with the p-type semiconductor layer 13a, in particular, a substance having a work function of 5.0 eV or more is preferably selected. In this case, as shown in FIG. 4, Schottky barriers between the second electrode (back electrode) 4 serving as a hole-injecting electrode and the p-type semiconductor layer 13b become smaller so that the hole injection from the second electrode 4 is efficiently carried out. The composition of the first buffer layer 7 is preferably made of one or more materials having a work function of 5 eV or more, such as Pt and Au.

<Manufacturing Method>

The following description will discuss one example of a method for manufacturing the display device 10 in accordance with first embodiment. FIGS. 7 to 10 are schematic perspective views that show the respective processes of the manufacturing method of the present embodiment.

(1) First, a glass substrate is prepared as a transparent substrate 1.

(2) On the glass substrate 1, a black matrix 19 is formed by using a resin material containing carbon black through a photolithography method. The black matrix 19 is disposed virtually in a lattice shape by using a plurality of linear patterns that extend in a first direction in parallel with the surface of the glass substrate 1 with predetermined intervals and a plurality of linear patterns that extend in a direction orthogonal to the first direction with predetermined intervals.

(3) Next, by using color resists, colored patterns are formed between adjacent matrix lines of the black matrix 19 by a photolithography method. These processes are repeatedly carried out for each of the colors of R, G and B so that a color filter 17 is formed.

(4) Next, a protective layer 18 is formed on each of the colored patterns of the color filter 17, and a transparent electrode 2 is formed on the protective layer 18 by a sputtering method. As the material for the transparent electrode 2, ITO is used, and the transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

(5) Next, Al is deposited on the protective layer 18 of the color filter 17 and the transparent electrode 2 as the first buffer layer 6 with a thickness of 200 nm by using a sputtering method.

(6) A planar phosphor layer 3 is formed on the first buffer layer 6. The phosphor layer 3 is formed in the following manner. First, ZnS and Ag are deposited on the first buffer layer 6 by using a vapor-phase growing method. In this case, a planar n-type ZnS layer is formed as the n-type semiconductor layer 13a under conditions of 600° C. in the substrate temperature and a thickness of 1 μm in the deposited layer.

(7) Next, ZnS is deposited on the n-type semiconductor layer 13a made of the n-type ZnS layer by using a vapor-phase growing method. In this case, a p-type ZnS layer is formed as the p-type semiconductor layer 13b by depositing ZnS and Ag at 600° C. in the substrate temperature with a thickness of 1 μm in a gas containing $NH_3$.

Figure 7:
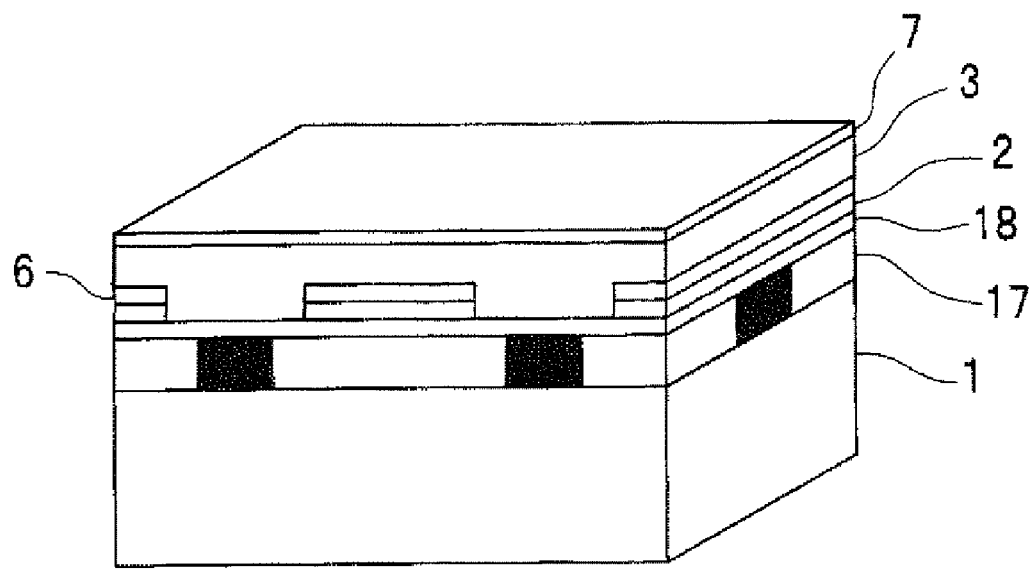
FIG. 7 is a schematic perspective view that shows one process of a method for manufacturing a display device in accordance with first embodiment of the present invention.

(8) Next, on the p-type ZnS layer serving as the p-type semiconductor layer 13b, Pt is deposited as a planar second buffer layer 7 by a photolithography method (FIG. 7). The film thickness is set to 400 nm. Thus, a two-layer phosphor layer 3 is configured by the n-type ZnS layer serving as the n-type semiconductor layer 13a and the p-type ZnS layer serving as the p-type semiconductor layer 13b.

Figure 8:
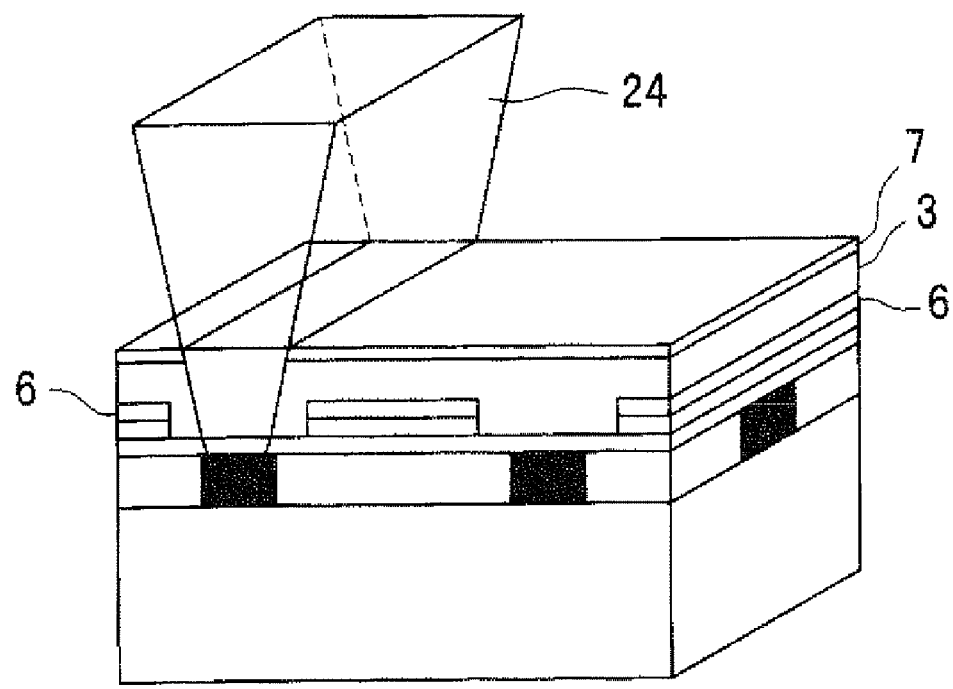
FIG. 8 is a schematic perspective view that shows another process of the method for manufacturing a display device in accordance with first embodiment of the present invention.
Figure 9:
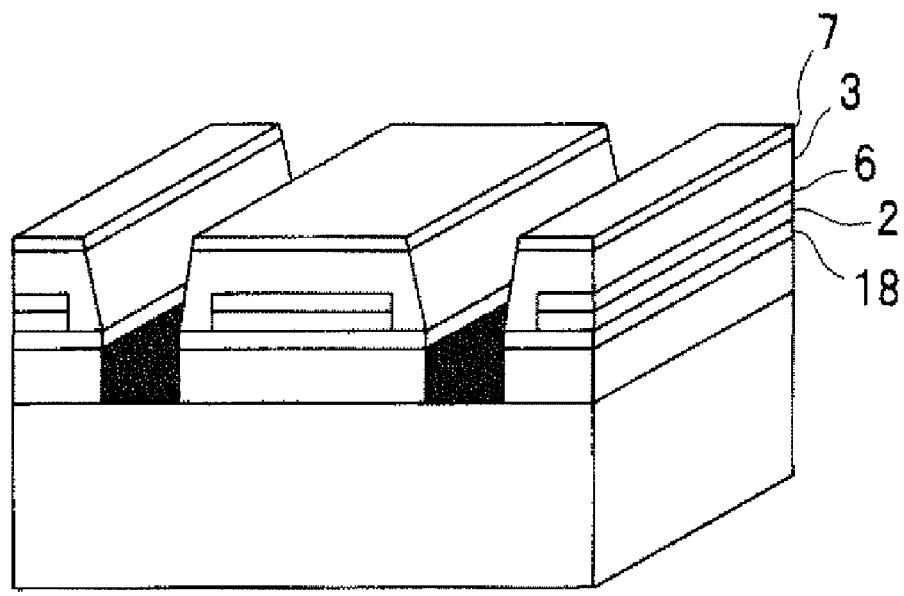
FIG. 9 is a schematic perspective view that shows still another process of the method for manufacturing a display device in accordance with first embodiment of the present invention.

(9) Next, a YAG laser beam 24 having a virtually linear shape is intermittently applied to the black matrix 19 that extends in the first direction from above the second buffer layer 7 so that the second buffer layer 7 and the phosphor layer 3 is patterned (FIG. 8). Additionally, the wavelength of the YAG laser 24 has a wavelength that is longer than the wavelength corresponding to a band gap relative to the protective layer 18 and the phosphor layer 3 that are virtually optically transparent, so that it is not absorbed so much by the protective layer 18 and the phosphor layer 3, but absorbed by the black matrix 19 located beneath these layers; thus, together with the surface layer portion of the black matrix 19, the protective layer 18 and the phosphor layer 3 are removed (FIG. 9).

(10) Next, a back electrode 4 is formed on the second buffer layer 7 and the phosphor layer 3 by a sputtering method. As the material for the back electrode 4, Pt is used, and the back electrode 4 is formed in a manner so as to be located between adjacent lines of the black matrix 19 and to extend virtually in parallel therewith, with predetermined intervals between one another, relative to the matrix lines of the black matrix 19 that extend in the second direction. As a result, the transparent electrode 2 and the back electrode 4 are made orthogonal to each other on the colored patterns of the color filter 17, and also made face to face with each other with the phosphor layer 3 interposed therebetween.

(11) Next, an insulating protective layer 11 is formed on the second buffer layer 7 and the back electrode 4.

By using the above-mentioned processes, a display device 10 of the present embodiment is obtained.

Figure 10:
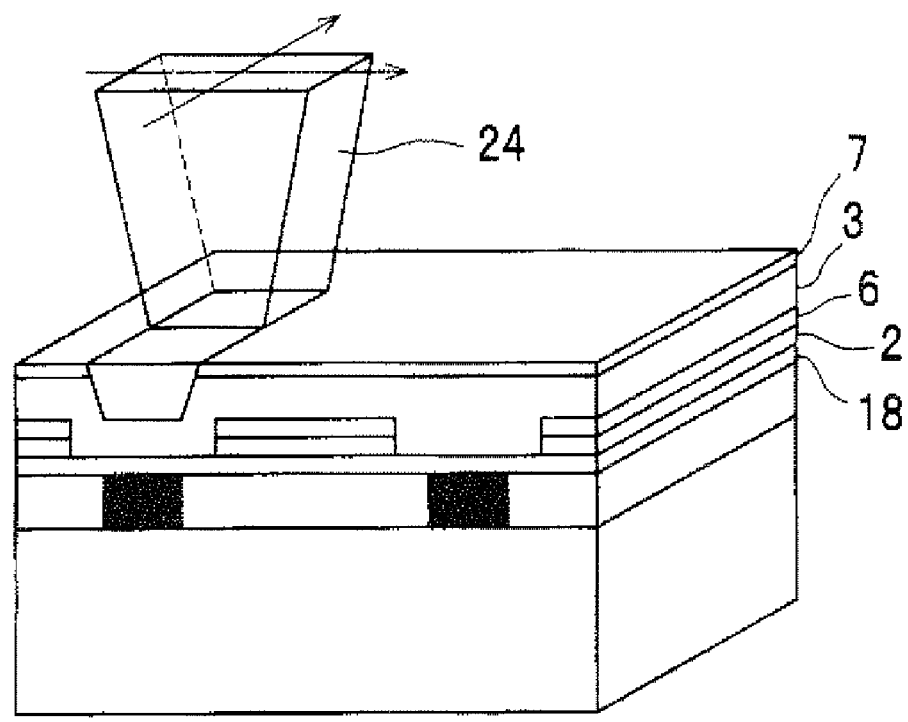
FIG. 10 is a schematic perspective view that shows the other process of the method for manufacturing a display device in accordance with first embodiment of the present invention.

Additionally, the spot shape of the laser 24 may be formed into a virtually dot shape. In this case, the patterning process of the phosphor layer 3 can be carried out by scanning the laser spot in the first direction as well as in the second direction (FIG. 10).

Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern.

<Effects>

In the display device in accordance with first embodiment, by removing the phosphor layer 3 located in an interpixel region between adjacent pixels over the same plane of the phosphor layer 3, a non-pixel region 3b having a higher resistance than that of the phosphor layer 3 of the pixel region 3a is formed. With this arrangement, even with a display device using a low resistance phosphor layer 3 that exhibits electroluminescent light emission, it is possible to greatly reduce crosstalk at the time of a displaying operation, and consequently to improve the display quality.

Second Embodiment

<Schematic Structure of Display Device>

The following description will discuss a display device in accordance with second embodiment. The schematic structure of this display device is shown in FIG. 1 in the same manner as in first embodiment. In comparison with the display device of first embodiment, the display device of second embodiment is characterized in that an alkali metal oxide such as CaO, BaO and SrO is used as the first buffer layer 6a. The present inventors have found that this alkali metal oxide has a characteristic for apparently raise the work function of the metal forming the electron-injecting electrode, and insert the first buffer layer 6a made of the alkali metal oxide between the first electrode (transparent electrode) 2 serving as the electron-injecting electrode and the phosphor layer 3. By using the alkali metal oxide as the first buffer layer 6a in this manner, the Schottky barrier between the first electrode 2 and the phosphor layer 3 can be reduced as shown in the energy band chart of FIG. 5. Thus, the injecting efficiency of electrons to the phosphor layer can be enhanced.

Figure 5:
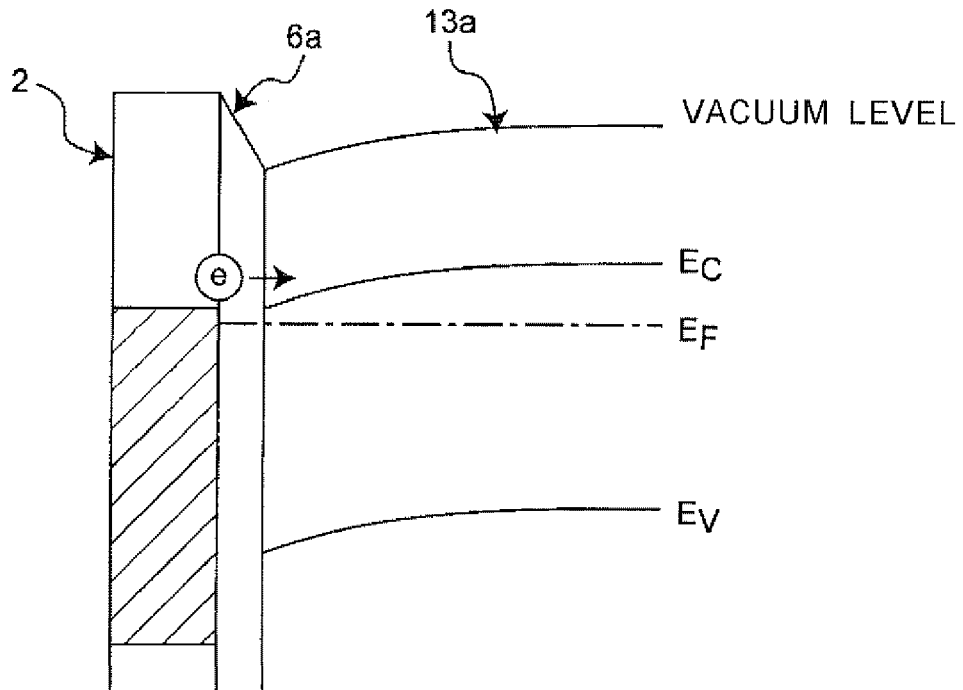
FIG. 5 is an energy band chart between a first electrode serving as an electron-injecting electrode and an n-type semiconductor layer of a display device in accordance with second embodiment.

FIG. 5 shows an energy band chart in a case where an alkali metal oxide is used as the first buffer layer 6a. Although the reason for generation of the function for apparently lowering the work function of the metal by the alkali metal oxide has not been clarified, the present inventors consider that this function is generated due to a strong polarization occurring in the oxide. The work function of the transparent electrode 2 becomes smaller apparently to form an ohmic contact between the transparent electrode 2 and the n-type semiconductor layer 13a. Additionally, there is a first buffer layer 6a made of MgO or the like between the transparent electrode 2 and the n-type semiconductor layer 13a, and when the thickness of the first buffer layer 6a is sufficiently thin, electrons are allowed to move from the transparent electrode 2 to the n-type semiconductor layer 13a because of the tunnel effect.

The alkali metal oxide, that is, the first buffer layer 6a made of, for example, CaO, can be formed by using, for example, a sputtering method.

The present second embodiment has exemplified a structure in which only the first buffer layer 6a is prepared; however, another structure having not only the first buffer layer 6a, but also a second buffer layer 7, may also be used. Moreover, the film-forming method for the respective layers is not intended to be limited by the above-mentioned method.

Third Embodiment

<Schematic Structure of Display Device>

Figure 6:
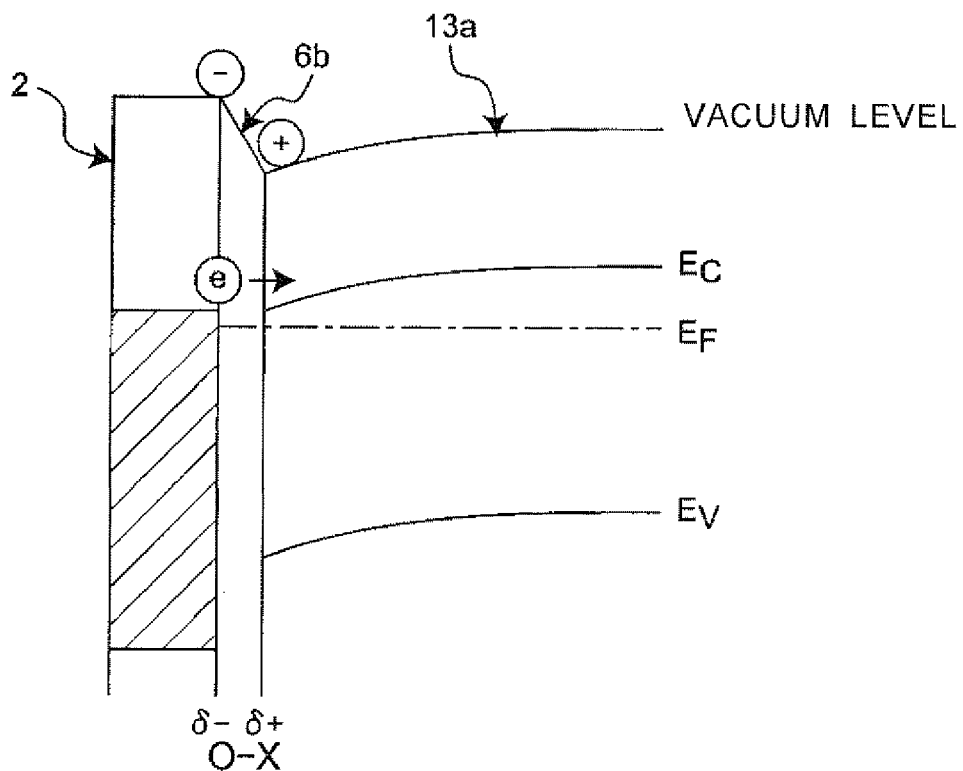
FIG. 6 is an energy band chart between a first electrode serving as an electron-injecting electrode and an n-type semiconductor layer of a display device in accordance with third embodiment.

The following description will discuss a display device in accordance with third embodiment. The schematic structure of this display device is shown in FIG. 1 in the same manner as in first embodiment. In comparison with the display device of first embodiment, the display device of third embodiment is characterized in that a layer, including a substance having a high electro-negativity of about 3 or more, such as oxygen and fluorine, is used as the first buffer layer 6b. The substance having an electro-negativity of 3 or more forms an electric dipole on the interface between the n-type semiconductor layer 13a and the first buffer layer 6b. By the effect of this electric dipole, the band on the transparent electrode 2 side is raised as shown in the energy band chart of FIG. 6 so that the height of the Schottky barrier with the n-type semiconductor layer 13a is lowered. Additionally, the thickness of the first buffer layer 6b is not required to be made thicker, and is sufficiently made with a thickness of 1 to several atom layers.

The first buffer layer 6b, including the substance having a high electric negativity of about 3 or more, such as oxygen and fluorine, can be prepared by using, for example, the following processes.

a) A sample is maintained in a high-vacuum chamber to which a $CH_3F$ gas is introduced.

b) Thereafter, by applying UV rays thereto, the surface is coated with fluorine with about one atom layer, as the first buffer layer 6b.

Additionally, the present third embodiment is exemplified by a structure having only the first buffer layer 6b; however, another structure having not only the first buffer layer 6b, but also a second buffer layer 7 together therewith, may also be used. Moreover, the film-forming method for the respective layers is not intended to be limited by the above-mentioned method.

<Effects>

In the display device in accordance with the present embodiment, by reducing the Schottky barrier between the phosphor layer and the electrode, it becomes possible to obtain sufficient emission luminance required even at a low voltage.

Fourth Embodiment

<Schematic Structure of Display Device>

Figure 11:
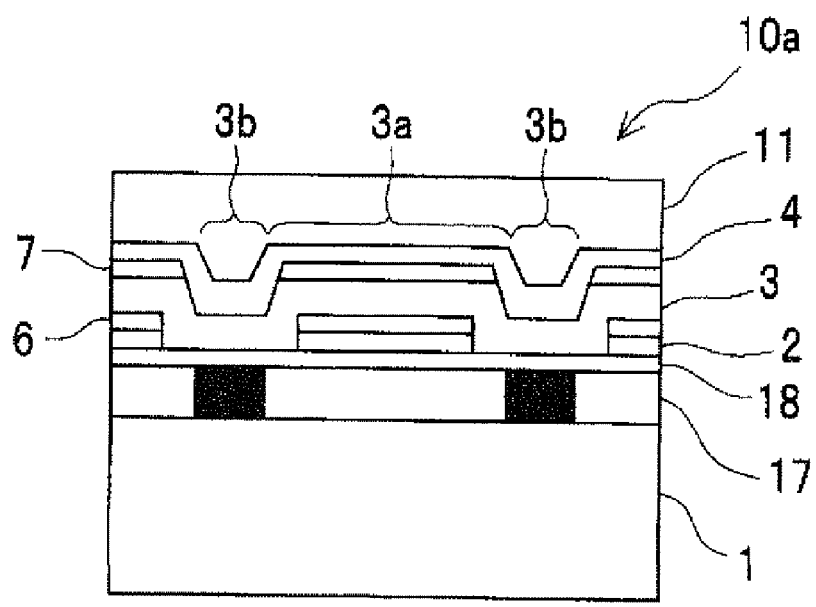
FIG. 11 is a schematic cross-sectional view that shows a structure of a display device in accordance with second embodiment of the present invention.

FIG. 11 is a schematic perspective view that shows a structure of a display device 10a in accordance with fourth embodiment of the present invention. This display 10a is different from the display device of first embodiment in that, in the interpixel region between the adjacent pixels, only an upper layer portion of the phosphor layer 3 is removed so that the respective pixel regions 3a are divided from each other. The regions from which the upper layer portions of the phosphor layer 3 have been removed are allowed to have a relatively thinner film thickness of the phosphor layer 3 in comparison with those peripheral regions without being removed portions, and consequently to have a relatively higher resistance in the direction in parallel with the light-emitting surface.

<Manufacturing Method>

The following description will discuss one example of a method for manufacturing the display device 10a in accordance with fourth embodiment. FIGS. 12 to 15 are schematic perspective views that show the respective processes of the manufacturing method of the present embodiment.

Figure 12:
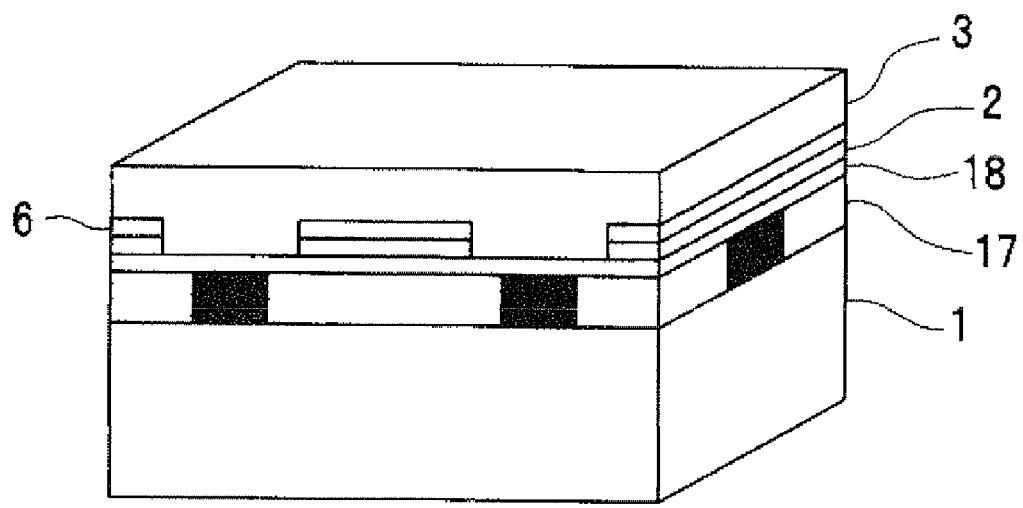
FIG. 12 is a schematic perspective view that shows one process of a method for manufacturing a display device in accordance with second embodiment of the present invention.

(1) A phosphor layer 3 is formed on a glass substrate 1 in a solid state in the same manner as in the method for manufacturing the display device in accordance with the aforementioned first embodiment (FIG. 12).

Figure 13:
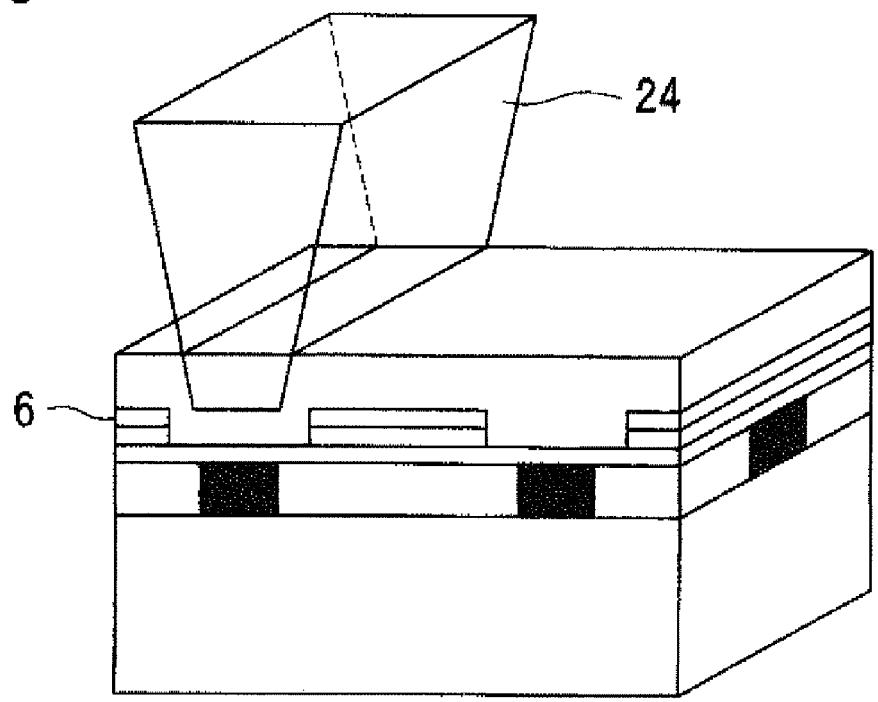
FIG. 13 is a schematic perspective view that shows another process of the method for manufacturing a display device in accordance with second embodiment of the present invention.
Figure 14:
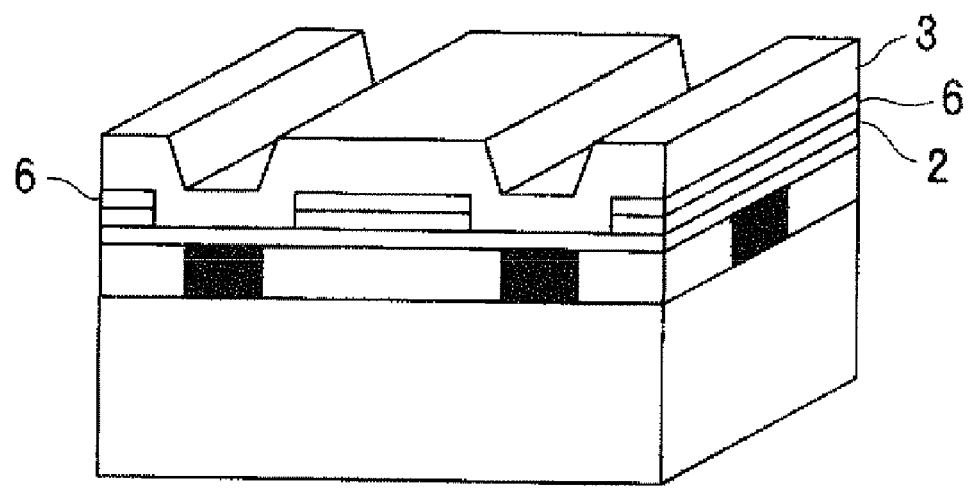
FIG. 14 is a schematic perspective view that shows still another process of the method for manufacturing a display device in accordance with second embodiment of the present invention.

(2) Next, a virtually linear excimer laser 24 is applied to an area that is virtually in parallel with the stripe-shaped transparent electrode 2 and located between adjacent transparent electrodes 2 from above the phosphor layer 3 so that the phosphor layer 3 is patterned (FIG. 13). The excimer laser 24 generates light having a comparatively short wavelength in the ultraviolet-ray range. In this wavelength, since the laser energy is absorbed by the phosphor layer 3 that is virtually transparent, only the portion irradiated with the laser 24 can be selectively heated locally so that the upper layer portion of the phosphor layer 3 is removed (FIG. 14).

(3) Next, in the same manner as in the manufacturing method for the display device of the aforementioned first embodiment, a second buffer layer 7, a back electrode 4 and a protective layer 11 are formed on the phosphor layer 3. The back electrode 4 and the transparent electrode 2 are made orthogonal to each other on the colored patterns of the color filter 17, and also made face to face with each other with the phosphor layer 3 interposed therebetween.

By using the above-mentioned processes, the display device 10a of the present embodiment is obtained.

Figure 15:
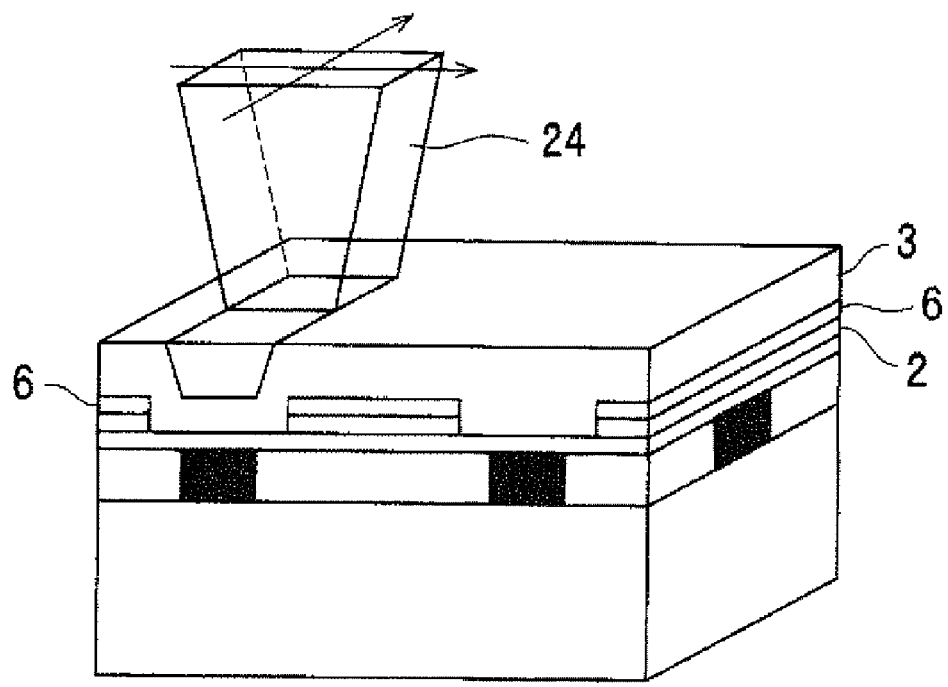
FIG. 15 is a schematic perspective view that shows the other process of the method for manufacturing a display device in accordance with second embodiment of the present invention.

Additionally, the spot shape of the laser 24 may be formed into a virtually dot shape. In this case, the patterning process of the phosphor layer 3 can be carried out by scanning the laser spot 24 in the first direction as well as in the second direction (FIG. 15). Moreover, a mask pattern having an opening through which an area to be irradiated with the laser 24 is exposed is superposed on the phosphor layer 3 so that the area covering a plurality of pixels and a plurality of electrodes may be subjected to a laser irradiation at one time from above the mask pattern. Moreover, a second buffer layer 7 is formed on the phosphor layer 3, and the patterning process may be carried out on the second buffer layer 7.

<Effects>

In the display device 10a of the present embodiment, by removing the phosphor layer 3 located in an interpixel region between adjacent pixels over the same plane of the phosphor layer 3, an area that makes the phosphor layer 3 disconnected is formed so that a non-pixel region 3b having a higher resistance than that of the phosphor layer 3 of the pixel region 3a is formed. With this arrangement, even with a display device using a low resistance phosphor layer that exhibits electroluminescent light emission, it is possible to greatly reduce crosstalk at the time of a displaying operation, and consequently to improve the display quality.

Fifth Embodiment

<Schematic Structure of Display Device>

Figure 16:
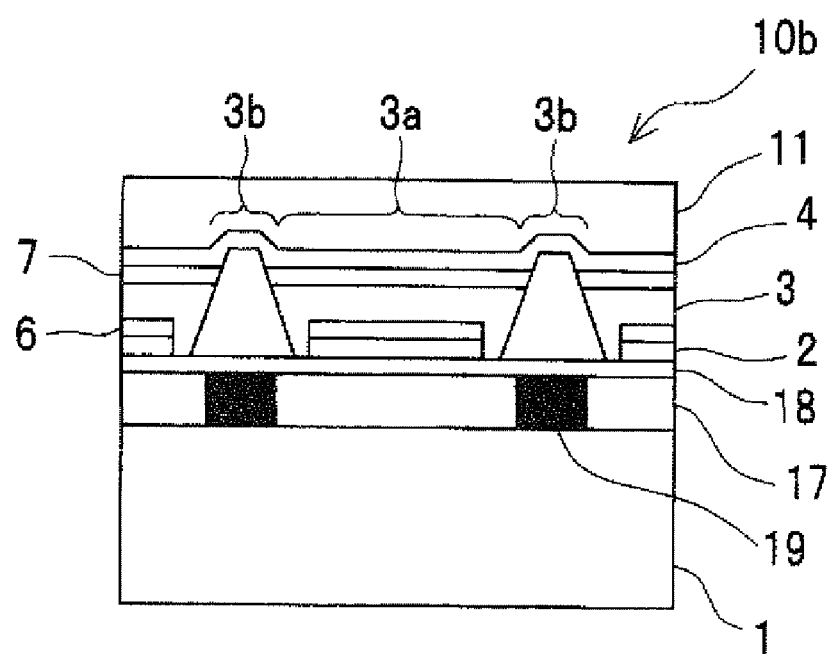
FIG. 16 is a schematic cross-sectional view that shows a structure of a display device in accordance with third embodiment of the present invention.

FIG. 16 is a schematic cross-sectional view that shows a structure of a display device 10b in accordance with third embodiment. This display 10b is different from the display device of first embodiment in that, in the interpixel region between the adjacent pixels 3a, a barrier plate 26 is formed as a non-pixel region 3b so that the respective pixel regions 3a are divided over the phosphor layer 3.

As the barrier plate 26, a material having higher resistance in comparison with the phosphor layer 3 can be used. The barrier plate 26 may be formed by using, for example, an organic material, an inorganic material and the like. Examples of the organic material include polyimide resin, acrylic resin, epoxy resin and urethane resin. Moreover, examples of the inorganic material include $SiO_2$, SiNx, alumina and the like, or a composite structure, such as a laminated structure and a mixed structure (for example, a binder in which an inorganic filler is dispersed) of these materials, may be used. The shape of the barrier plate 26 is not particularly limited, but the height of the barrier plate 26 is preferably set to about 0.5 to 1.5 times the film thickness of the phosphor layer 3. Moreover, the width of the barrier plate 26 is preferably set to 0.5 to 1.5 times the interval between the adjacent transparent electrodes.

<Manufacturing Method>

The following description will discuss one example of a method for manufacturing a display device 10b in accordance with fifth embodiment. FIGS. 17 to 20 are schematic perspective views that show the respective processes of the manufacturing method of the present example. Additionally, with respect to the phosphor layers made of the aforementioned other materials, the same manufacturing method may also be utilized.

Figure 17:
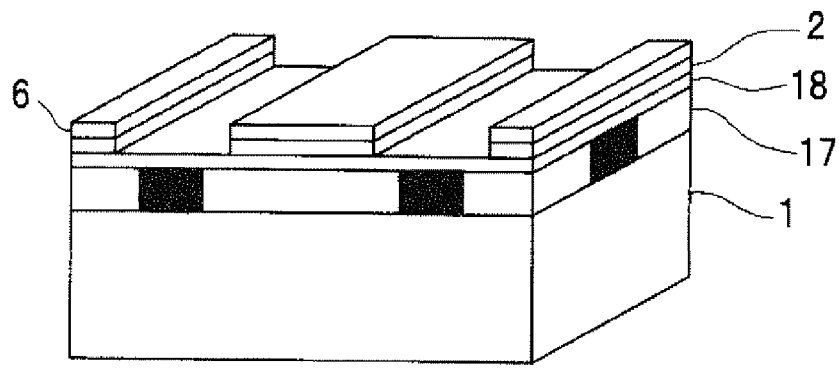
FIG. 17 is a schematic perspective view that shows one process of a method for manufacturing a display device in accordance with third embodiment of the present invention.

(1) In the same manner as in the method for manufacturing the display device of the aforementioned first embodiment, a color filter 17 is formed on a glass substrate 1, and a first protective layer 18 is formed thereon. Moreover, a transparent electrode 2 and a first buffer layer 6 are formed on the first protective layer 18. The transparent electrode and the first buffer layer 2 are provided as being located between adjacent lines of the black matrix 19 and to extend virtually in parallel therewith, with predetermined intervals between one another, relative to the matrix lines of the black matrix 19 that extend in the first direction (FIG. 17).

Figure 18:
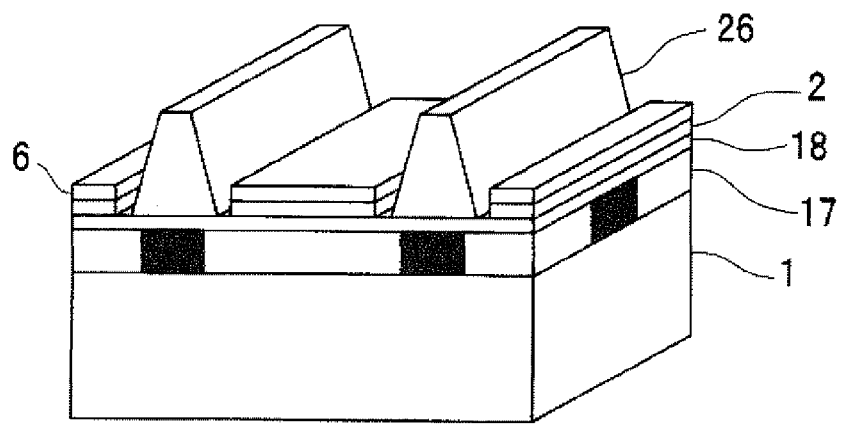
FIG. 18 is a schematic perspective view that shows another process of the method for manufacturing a display device in accordance with third embodiment of the present invention.
Figure 19:
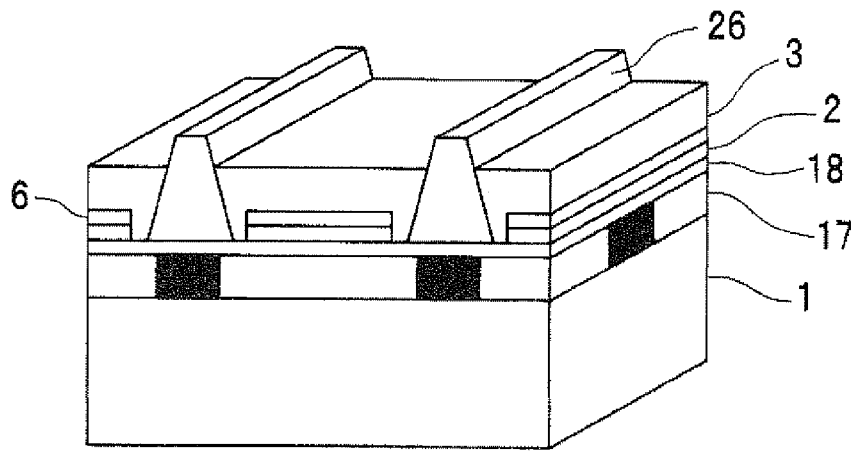
FIG. 19 is a schematic perspective view that shows still another process of the method for manufacturing a display device in accordance with third embodiment of the present invention.

(2) Next, barrier plates 26 are formed on the first protective layer 18. The barrier plates 26 are formed in the following manner. First, a glass paste in which alumina powder is dispersed is formed into a stripe pattern by a screen printing process, with each stripe being located between the adjacent transparent electrodes 2 so as to extend in a first direction. Then, this is fired to obtain barrier plates 26 formed into a desired pattern (FIG. 18).

(3) Next, in the same manner as in the method for manufacturing the display device relating to the aforementioned first embodiment, a phosphor layer 3 is formed on the transparent electrode 2 and the first buffer layer 6. The barrier plates 26 are shield by using a metal mask (FIG. 18).

(4) Next, in the same manner as in the method for manufacturing the display device relating to the aforementioned first embodiment, a second buffer layer 7, a back electrode 4 and a second protective layer 11 are formed on the phosphor layer 3. The back electrode 4 is made orthogonal to the transparent electrode 2 on the colored patterns of the color filter 17, and also made face to face therewith, with the phosphor layer 3 interposed therebetween.

By using the above-mentioned processes, a display device 10b of the present embodiment is obtained.

Figure 20:
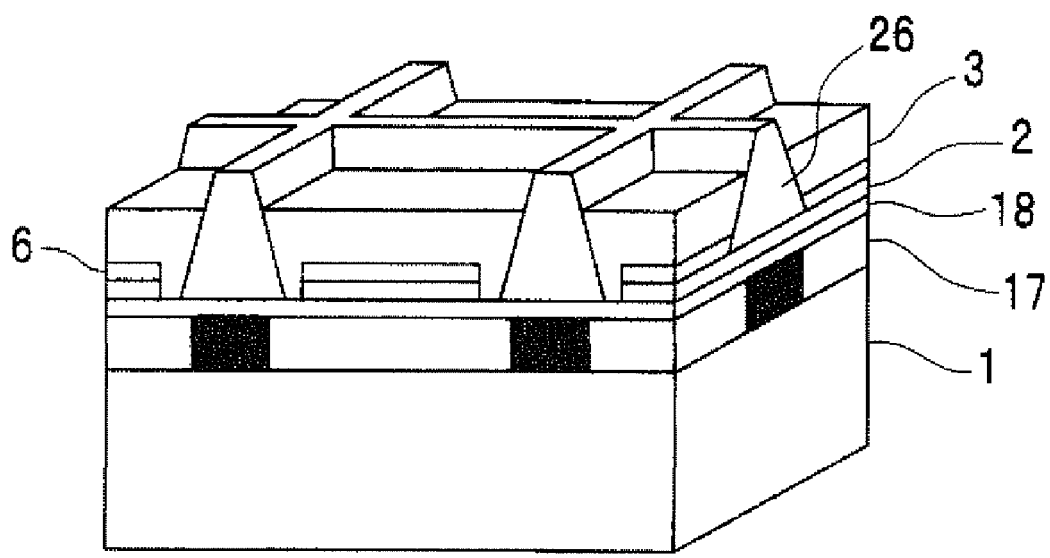
FIG. 20 is a schematic perspective view that shows the other process of the method for manufacturing a display device in accordance with third embodiment of the present invention.

Additionally, the pattern shape of the barrier plates 26 may be formed into a virtually lattice shape. In this case, each of the barrier plates 26 located in a manner so as to extend in the second direction is positioned between the adjacent back electrodes 4 (FIG. 20).

Moreover, the method for forming the barrier plates 26 is not intended to be limited by the screen printing method, and other methods, such as etching by the photolithography method, a sand-blasting method and an ink-jet method, may be used.

<Effects>

In the display device 10b of the present embodiment, each of the barrier plates 26, mainly made of an insulating resin, is formed in an interpixel region between adjacent pixels 3a over the same plane of the phosphor layer 3 so that a non-pixel region 3b having a higher resistance than that of the phosphor layer 3 of the pixel region 3a is formed. With this arrangement, even with a display device using a low resistance phosphor layer 3 that exhibits electroluminescent light emission, it is possible to greatly reduce crosstalk at the time of a displaying operation, and consequently to improve the display quality.

Sixth Embodiment

<Manufacturing Method>

Figure 21:
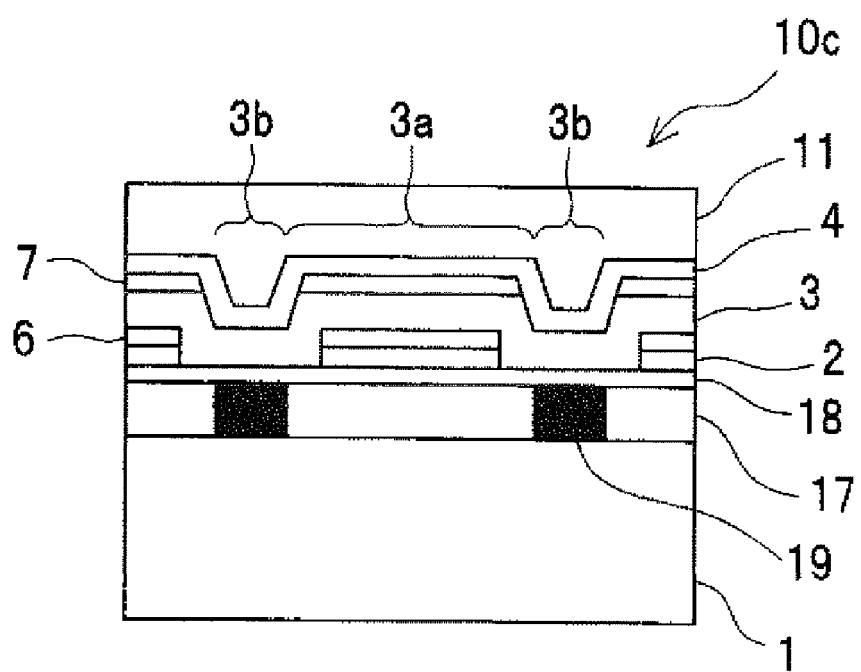
FIG. 21 is a schematic cross-sectional view that shows a structure of a display device in accordance with fourth embodiment of the present invention.

FIG. 21 is a schematic structural view that shows a display device 10c in accordance with sixth embodiment. This display 10c, which has the same structure and shape as those of the display device in accordance with fourth embodiment, is different therefrom in its manufacturing method. The following description will discuss one example of the method for manufacturing the display device 10c in accordance with sixth embodiment. FIGS. 22 to 25 are schematic perspective views that show the respective processes of the manufacturing method of the present example.

(1) In the same manner as in the method for manufacturing the display device of the aforementioned first embodiment, a transparent electrode 2 and a first buffer layer 6 are formed on a glass substrate 1. The transparent electrode 2 and the first buffer layer 6 are formed in a manner so as to be located between adjacent lines of the black matrix 19 and to extend virtually in parallel therewith, with predetermined intervals between one another, relative to the matrix lines of the black matrix 19 that extend in the first direction.

Figure 22:
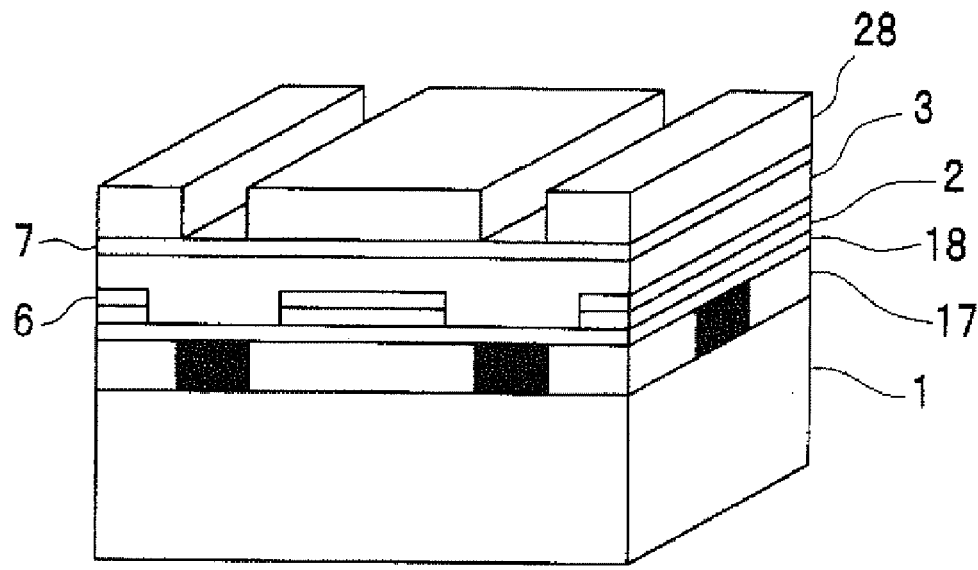
FIG. 22 is a schematic perspective view that shows one process of a method for manufacturing a display device in accordance with fourth embodiment of the present invention.

(2) Thereafter, in the same manner as in the method for manufacturing the display device relating to the aforementioned first embodiment, a phosphor layer 3 is formed thereon in a solid state, a second buffer layer 7 is further formed and this is then subjected to a photolithography method by using a photosensitive resist so that a mask pattern 28 is formed. This mask pattern 28 is designed so as to be located between adjacent transparent electrodes, and to extend in the first direction in parallel therewith, with openings formed therein with predetermined intervals from one another (FIG. 22).

Figure 23:
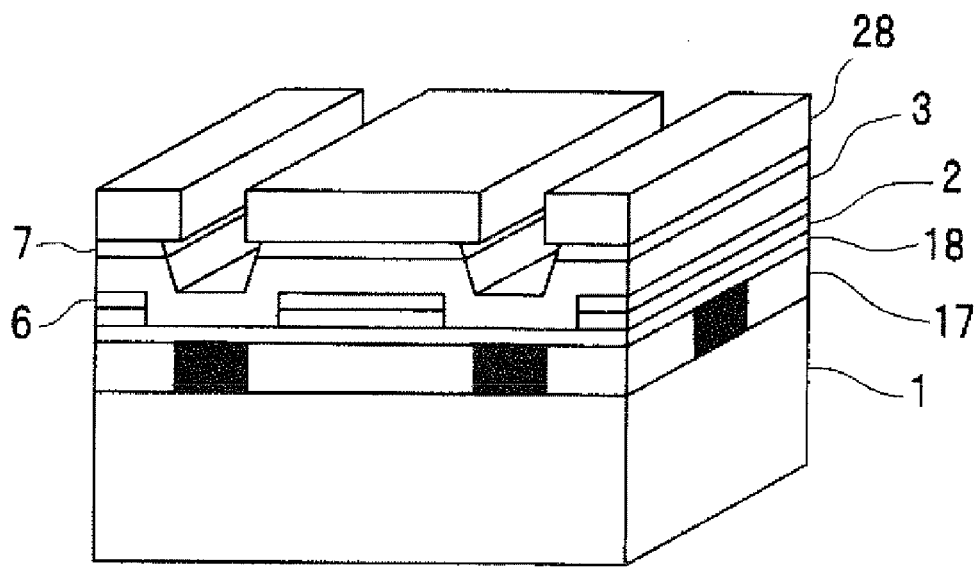
FIG. 23 is a schematic perspective view that shows another process of the method for manufacturing a display device in accordance with fourth embodiment of the present invention.

(3) Next, the exposed portions of the second buffer layer 7 and the phosphor layer 3 are etched by using a dry etching method so as to have a desired thickness (FIG. 23).

Figure 24:
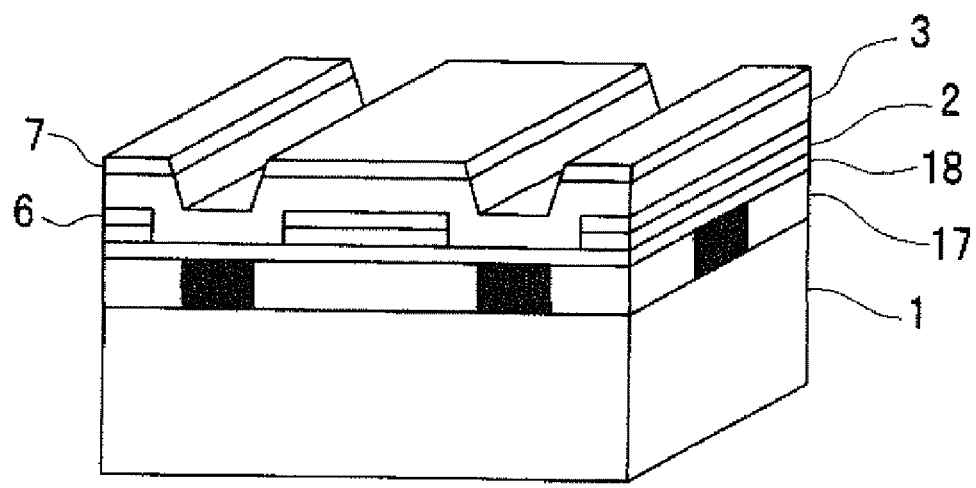
FIG. 24 is a schematic perspective view that shows still another process of the method for manufacturing a display device in accordance with fourth embodiment of the present invention.

(4) Next, the mask pattern 28 made of the photosensitive resist is removed (FIG. 24).

(5) Thereafter, in the same manner as in the method for manufacturing the display device relating to the aforementioned first embodiment, a back electrode 4 and a protective layer 11 are formed on the second buffer layer and the phosphor layer 3. The back electrode 4 and the transparent electrode 2 are made orthogonal to each other on the colored patterns of the color filter 17, and also made face to face with each other, with the phosphor layer 3 interposed therebetween.

The display device 10c of the present example is obtained by the above-mentioned processes.

Figure 25:
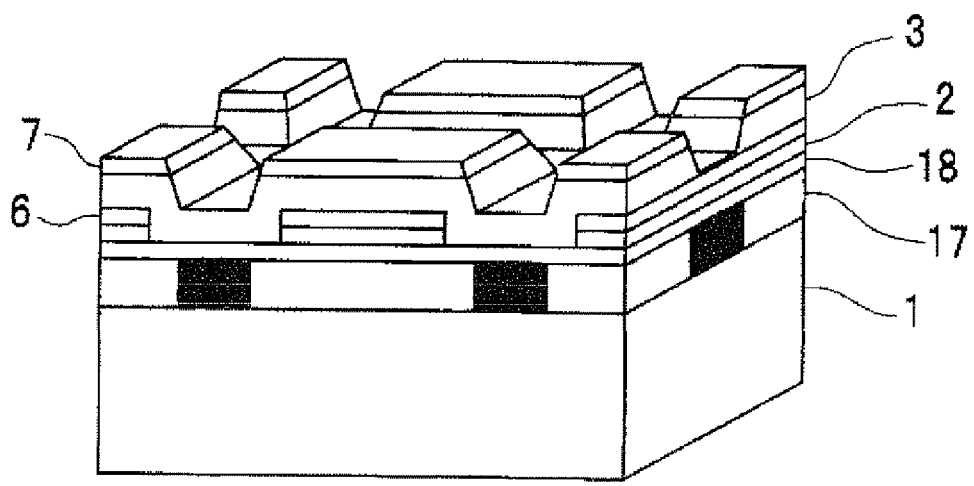
FIG. 25 is a schematic perspective view that shows the other process of the method for manufacturing a display device in accordance with fourth embodiment of the present invention.

Additionally, the pattern shape of the mask pattern 28 made of the photosensitive resist for use in the etching process is not limited by the above-mentioned stripe shape, but may be formed into a virtually lattice shape. In this case, the openings that are located to extend in the second direction, each being positioned between the adjacent back electrodes 4, are also placed in parallel with one another with predetermined intervals therebetween (FIG. 25).

Moreover, the etching method is not intended to be limited by the dry etching and another method, such as a wet-etching method and a sand-blasting method, may be used.

Figure 26:
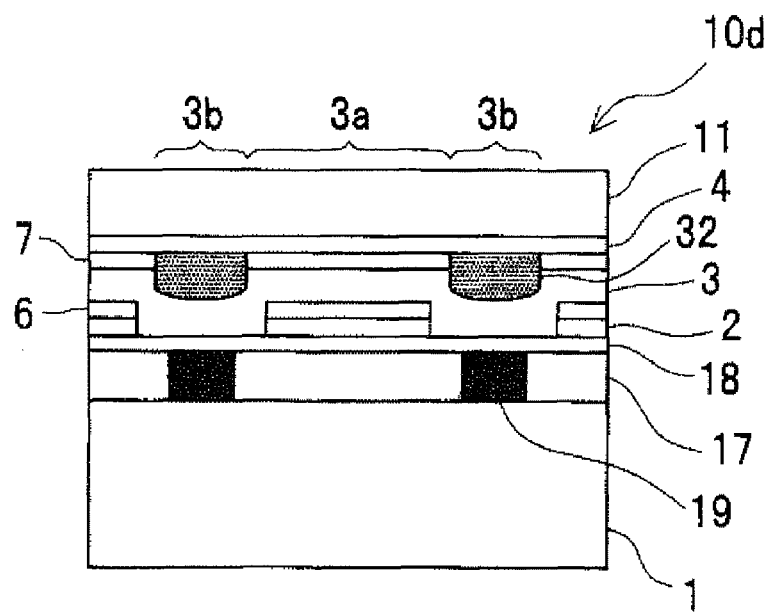
FIG. 26 is a schematic cross-sectional view that shows a structure of a modified example of a display device in accordance with fourth embodiment of the present invention.

Furthermore, FIG. 26 shows a display device 10d that is a modified example of sixth embodiment. This display device 10d differs from the display device 10c of sixth embodiment in that the etching process is not carried out to such an extent as to remove at least one portion of the phosphor layer 3. In the display device 10d of this modified example, during a wet etching process, the etching liquid that has permeated into the phosphor layer 3 to be dispersed therein forms a high resistance region 32 on one portion of the interpixel region (non-pixel region) 3b between the adjacent pixel regions 3a inside the phosphor layer 3.

<Effects>
In the display device of the present sixth embodiment, an area having a higher resistance than that of the pixel region 3a is formed in an interpixel region 3b between the adjacent pixels over the same plane of the phosphor layer 3. Thus, even with a display device using a low resistance phosphor layer 3 that exhibits electroluminescent light emission, it is possible to greatly reduce crosstalk at the time of a displaying operation, and consequently to improve the display quality.

Seventh Embodiment)

Figure 27:
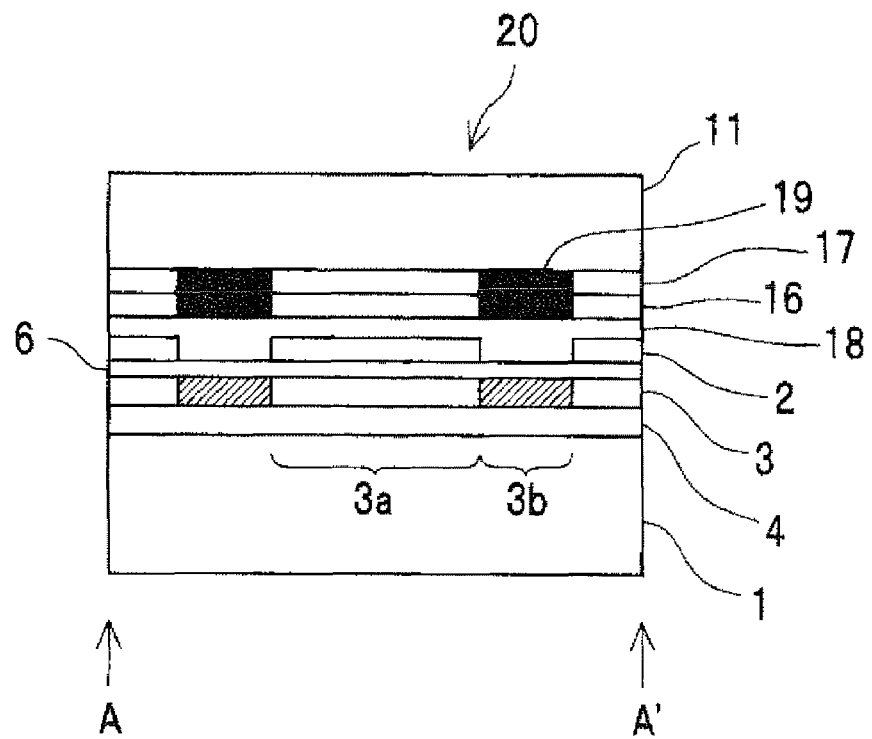
FIG. 27 is a schematic cross-sectional view that shows a structure of a display device in accordance with fifth embodiment of the present invention.

<Schematic Structure of Display Device>
FIG. 27 is a schematic cross-sectional view that shows a cross-sectional structure of a display device 20 in accordance with seventh embodiment of the present invention. In this display device 20, a phosphor layer 3 containing an illuminant is formed between a transparent electrode 2 serving as a first electrode and a back electrode 4 serving as a second electrode. Moreover, a first buffer layer 6 is formed in a manner so as to be sandwiched between the transparent electrode 2 and the phosphor layer 3. A substrate 1, which supports these electrodes, is formed adjacent to the back electrode 4. The transparent electrode 2 and the back electrode 4 are electrically connected to each other with a power supply interposed therebetween. When power is supplied from the power supply, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2, and is taken out from the display device 20. In the display device 20 of the present embodiment, a DC power supply is used as the power supply. As shown in FIG. 27, the color filter 17 is provided on the transparent electrode 2. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB.

On the other hand, not limited to the above-mentioned structure, for example, another structure may be used in which a plurality of phosphor layers 3 are formed, both of the first and second electrode are prepared as the transparent electrodes, the back electrode 4 is prepared as a black-colored electrode, a structure for sealing the entire portion or one portion of the display device 20 by the protective layer 11 is further provided, or a color-converting structure (color-conversion layer 16) that converts the color of light emission from the phosphor layer 3 is further prepared in front of the color filter 17.

<Manufacturing Method>
The following description will discuss one example of a method for manufacturing a display device 20 in accordance with fifth embodiment.

(1) First, a glass substrate is prepared as a substrate 1.

(2) Next, a back electrode 4 is formed on the substrate 1 by using a sputtering method. In this case, Pt is used as the back electrode 4, and the back electrode 4 is formed as a plurality of linear patterns that extend in a first direction in parallel with the surface of the glass substrate 1, in parallel with one another, with predetermined intervals being formed therebetween.

(3) Next, a phosphor layer 3 is formed in a solid state from the glass substrate 1 to the back electrode 4, in the same manner as in first embodiment.

Figure 28:
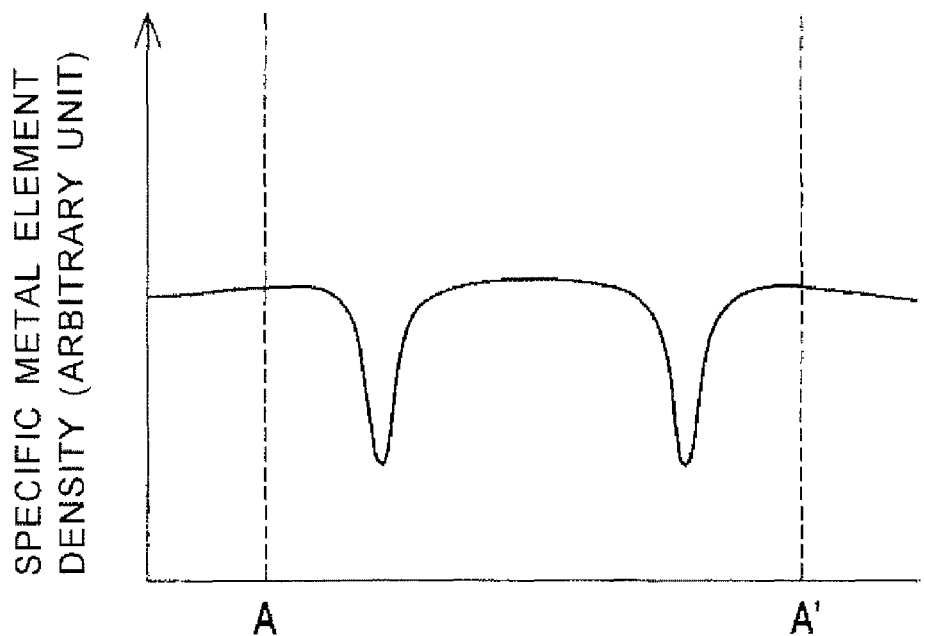
FIG. 28 is a graph that shows a change in a specific metal element concentration taken along line A-A' of a phosphor layer 3 of FIG. 26.

(4) Next, after a dopant material has been vapor deposited by using a mask on a region 3a corresponding to pixels on the phosphor layer 3, the dopant is heated and diffused by using an annealing process. Thus, the phosphor layer 3 forms a dopant density distribution including the pixel region 3a with a high density and the interpixel regions 3b with a low density, within the in-plane thereof. FIG. 28 shows a state of the dopant density distribution at this time. A specific dopant material, for example, Zn or the like forms a factor for reducing the resistance of the phosphor layer. The interpixel regions 3b, which have a lower dopant density than that of the pixel region 3a, are allowed to have resistance higher than that of the pixel region 3a. Simultaneously, the host substance within the phosphor layer 3 is progressively crystallized to also exert an effect for reducing the density of the non-light emission recombination center.

(5) Next, Al is deposited on the phosphor layer 3 with a thickness of 200 nm as a first buffer layer 6, by using a sputtering method.

(6) Next, a transparent electrode 2 is formed on the first buffer layer 6 by a sputtering method. As the material for the transparent electrode 2, ITO is used, and the transparent electrode 2 is formed as a linear pattern having a plurality of lines that are located in parallel with the surface of the glass substrate 1 and extend in a second direction virtually orthogonal to the aforementioned first direction, in parallel with one another with predetermined intervals between one another.

(7) Next, after film-forming SiN as a protective layer from the phosphor layer 3 and the first buffer layer 6 to the transparent electrode 2, a black matrix 19 is formed by a photolithography method by using a resin material containing carbon black. The black matrix 19 is disposed virtually in a lattice shape by using a plurality of linear patterns that extend in the first direction in parallel with the surface of the glass substrate, between gaps of the back electrodes 4, and a plurality of linear patterns that extend in the second direction between gaps of the adjacent transparent electrodes 2.

(8) Next, by using color resists, colored patterns are formed between matrix lines of the black matrix 19 by a photolithography method. These processes are repeatedly carried out for the respective colors of R, G and B so that a color filter 17 is formed.

(9) Next, an insulating protective layer 11 is formed on the color filter 17 by using an epoxy resin.

By using the above-mentioned processes, a top-emission-type display device 20 of the present embodiment is obtained.

Figure 29:
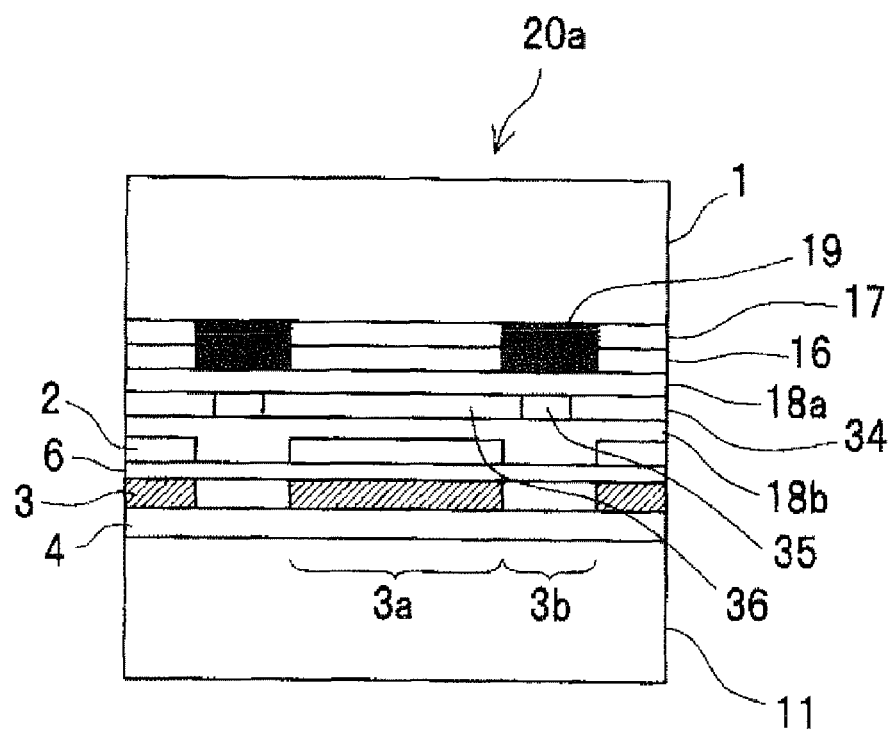
FIG. 29 is a schematic cross-sectional view that shows a structure of a modified example of a display device in accordance with fifth embodiment of the present invention.

Additionally, as the annealing means, an entire heating process by using an electric furnace or the like may be carried out, or a local heating process by using laser irradiation may be carried out. Moreover, as shown in FIG. 29, the color filter 17, formed on the glass substrate 1, and a color conversion layer 16 are bonded to each other with an adhesive layer 34 interposed therebetween so that a top-emission-type display device 20a of another example may be manufactured.

<Effects>

In the display device 20 in accordance with seventh embodiment, over the same plane of the phosphor layer 3, the phosphor layer 3b in the interpixel region between the adjacent pixel regions 3a is made to have higher resistance than that of the phosphor layer 3a in the pixel region so that even with a display device using a low resistance phosphor layer that exhibits electroluminescent light emission, it is possible to greatly reduce crosstalk at the time of a displaying operation, and consequently to improve the display quality.

Eighth Embodiment

<Schematic Structure of Display Device>

Figure 30:
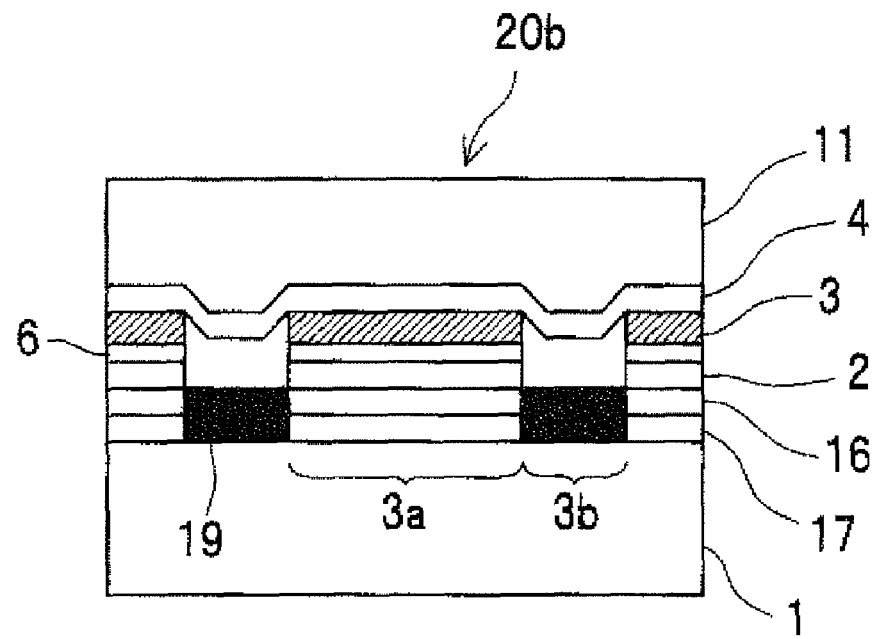
FIG. 30 is a schematic cross-sectional view that shows a structure of a display device in accordance with sixth embodiment of the present invention.

FIG. 30 is a schematic cross-sectional view that shows a structure of a display device 20b in accordance with sixth embodiment. This display 20b has a bottom-emission-type structure in which light emission is taken out from the transparent substrate 1 side. In this structure, virtually the same members as those of the first embodiment may be used, except that the color filter 17 and the color-conversion layer 16 are disposed at lower layers of the phosphor layer 3.

<Manufacturing Method>

The following description will discuss one example of a method for manufacturing the display device 20b in accordance with eighth embodiment.

(1) First, a glass substrate is prepared as a transparent substrate 1.

(2) On the glass substrate 1, a black matrix 19 is formed by using a resin material containing carbon black through a photolithography method. The black matrix 19 is disposed virtually in a lattice shape by using a plurality of linear patterns that extend in a first direction in parallel with the surface of the glass substrate 1 with predetermined intervals and a plurality of linear patterns that extend in a direction orthogonal to the first direction with predetermined intervals.

(3) Next, by using color resists, colored patterns are formed between adjacent matrix lines of the black matrix 19 by a photolithography method. These processes are repeatedly carried out for each of the colors of R, G and B so that a color filter 17 is formed.

(4) Next, a protective layer 16 is formed on each of the colored patterns of the color filter 17, and a transparent electrode 2 is formed on the protective layer 16 by a sputtering method. As the material for the transparent electrode 2, ITO is used, and the transparent electrode 2 is formed in a manner so as to be located between adjacent lines of the black matrix 19 and to extend virtually in parallel therewith, with predetermined intervals between one another, relative to the matrix lines of the black matrix 19 that extend in the first direction.

(5) Moreover, the first buffer layer 6 is formed on the transparent electrode 2 in the same manner as in second embodiment.

(6) Next, a phosphor layer 3 is formed in a solid state on the color-conversion layer 16, the transparent electrode 2, and the first buffer layer 6 in the same manner as in first embodiment. Moreover, by ion-injecting a dopant material to the region 3a corresponding to pixels on the phosphor layer 3, it is possible to form a dopant density distribution including the pixel region 3a with a high density and the interpixel regions 3b with a low density, within the in-plane of the phosphor layer 3.

(7) Next, a back electrode 4 is formed on the phosphor layer 3 by a sputtering method. As the material for the back electrode 4, Pt is used, and the back electrode 4 is formed in a manner so as to be located between adjacent lines of the black matrix 19 and to extend virtually in parallel therewith, with predetermined intervals between one another, relative to the matrix lines of the black matrix 19 that extend in the second direction. As a result, the transparent electrode 2 and the back electrode 4 are made orthogonal to each other on the colored patterns of the color filter 17, and also made face to face with each other with the phosphor layer 3 interposed therebetween.

(8) Next, an insulating protective layer 11 is formed on the phosphor layer 3 and the back electrode 4 by using an epoxy resin.

By using the above-mentioned processes, a bottom-emission-type display device 20b of the present embodiment is obtained.

In this display device 20b, each pixel includes a light-emitting element, and a plurality of pixels are disposed two-dimensionally to form this structure. In accordance with this display device 20b, it is possible to greatly reduce crosstalk at the time of a displaying operation, and consequently to improve the display quality in the same manner as in first embodiment.

Ninth Embodiment

<Schematic Structure of Display Device>

Figure 31:
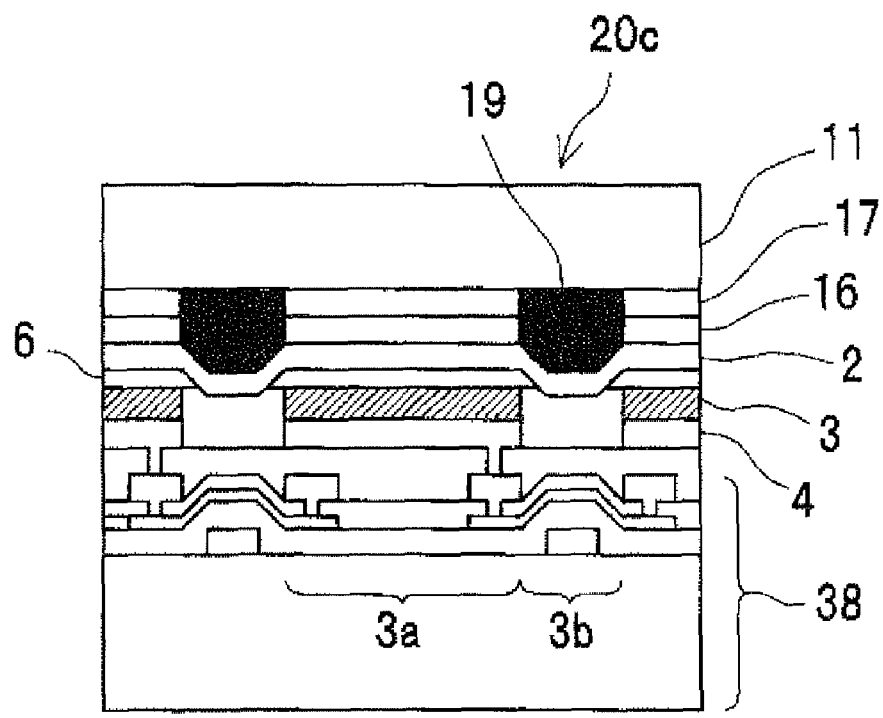
FIG. 31 is a schematic cross-sectional view that shows a structure of a display device in accordance with seventh embodiment of the present invention.

FIG. 31 is a cross-sectional view that shows a schematic structure of a display device 20c in accordance with ninth embodiment. This display device 20c is an active-driving type display device that uses a substrate 38 (hereinafter, referred to as "TFT substrate") in which a thin-film transistor for use in switching is installed in each of the pixels. This display device 20c is formed by successively stacking a back electrode 4, a phosphor layer 3 in a solid state, a first buffer layer 6 and a transparent electrode 2 in a solid state, each installed in each pixel, on the TFT substrate 38. This has a top-emission-type structure in which light emission is taken out from the transparent electrode 2 side. In this structure, virtually the same members as those of the first embodiment and the same manufacturing method as that of the first embodiment may be used, except that the TFT substrate 38 is used.

In the same manner as in the display device of the first embodiment, the display device 20c makes it possible to greatly reduce crosstalk at the time of a displaying operation, and consequently to improve the display quality.

Tenth Embodiment

<Schematic Structure of Display Device>

Figure 32:
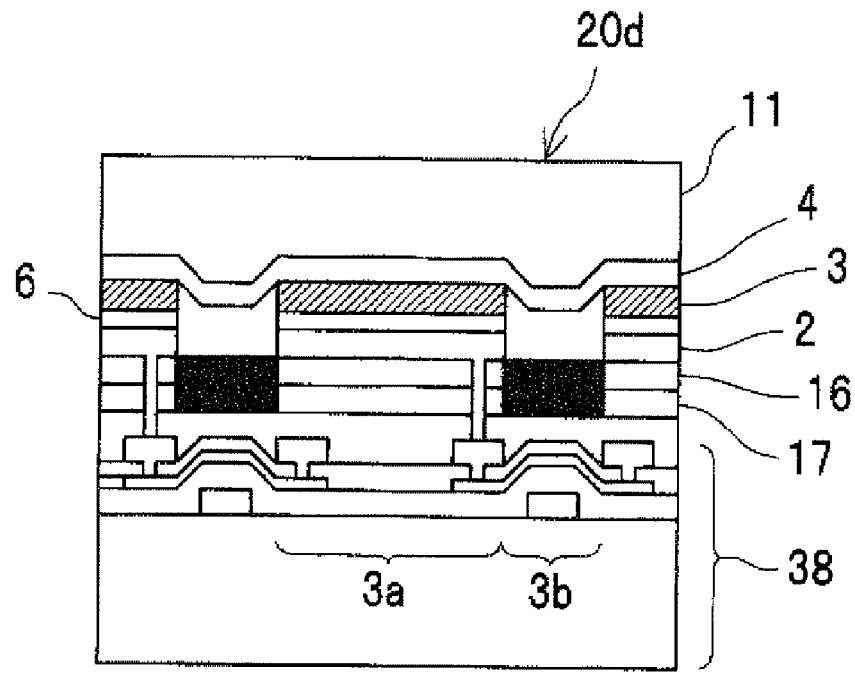
FIG. 32 is a schematic cross-sectional view that shows a structure of a display device in accordance with eighth embodiment of the present invention.

FIG. 32 is a cross-sectional view that shows a schematic structure of a display device 20d in accordance with tenth embodiment. This display device 20d has a bottom-emission type structure in which light emission is taken out from the TFT substrate 38 side. Since the color filter 17 and the color conversion layer 16 are disposed on the lower side of the phosphor layer 3, a dopant density distribution of the phosphor layer 3 is formed by using a manufacturing method in which no thermal stress is applied to the lower layer, in the same manner as in eighth embodiment. In this structure, virtually the same members as those of the ninth embodiment may be used, except for this density distribution forming process.

In the same manner as in the display device of the first embodiment, the display device 20d makes it possible to greatly reduce crosstalk at the time of a displaying operation, and consequently to improve the display quality.

Eleventh Embodiment

<Schematic Structure of Display Device>

Figure 33:
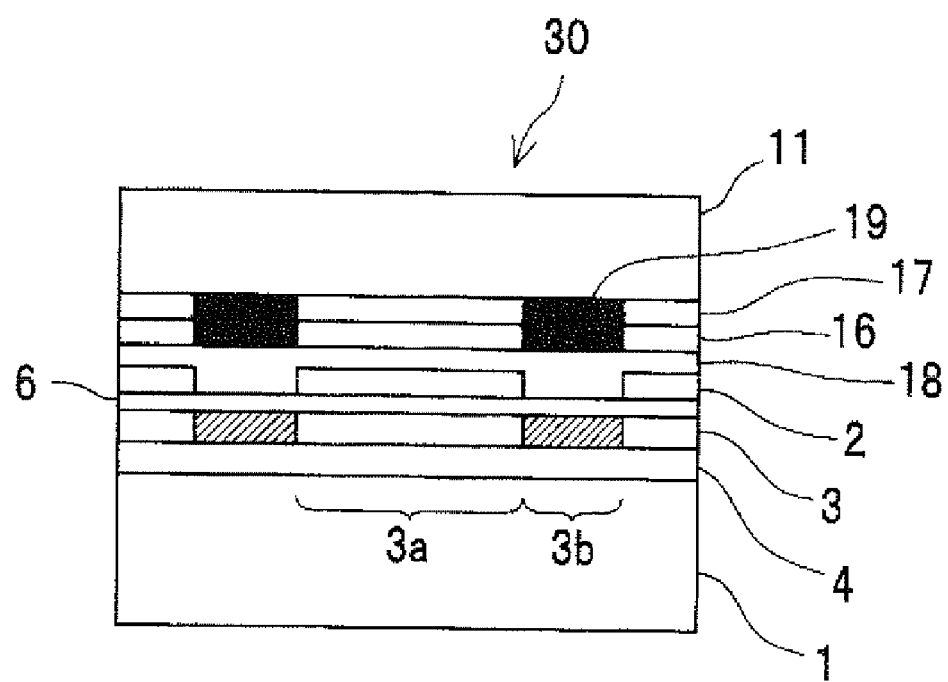
FIG. 33 is a schematic cross-sectional view that shows a structure of a display device in accordance with ninth embodiment of the present invention.

FIG. 33 is a schematic cross-sectional view that shows a cross-sectional structure of a display device 20 in accordance with eleventh embodiment of the present invention. In this display device 30, a phosphor layer 3 containing an illuminant is formed between a transparent electrode 2 serving as a first electrode and a back electrode 4 serving as a second electrode. Moreover, the first buffer layer 6 is formed in a sandwiched state between the transparent electrode 2 and the phosphor layer 3. A substrate 1, which supports these electrodes, is formed adjacent to the back electrode 4. The transparent electrode 2 and the back electrode 4 are electrically connected to each other with a power supply interposed therebetween. When power is supplied from the power supply, a potential difference is exerted between the transparent electrode 2 and the back electrode 4, and a voltage is applied thereto so that an electric current is allowed to flow through the phosphor layer 3. Thus, the illuminant of the phosphor layer 3 disposed between the transparent electrode 2 and the back electrode 4 is allowed to emit light, and the light is transmitted through the transparent electrode 2, and is taken out from the display device 20. In the display device 30 according to the eleventh embodiment, a DC power supply is used as the power supply. As shown in FIG. 33, the color conversion layer 16 and the color filter 17 are further provided on the transparent electrode 2. This color filter 17 is provided with a black matrix 19 formed on an area between adjacent pixels. Thus, a region corresponding to a pixel surrounded by the black matrix 19 selectively transmits light emitted from the phosphor layer 3 to each of the colors of RGB. Moreover, the color conversion layer 16 has a function for converting a light emission color from the phosphor layer 3 into a long wavelength light ray, and, for example, in a case where a blue-color light ray is emitted from the phosphor layer 3, the blue-color light ray is converted into a green-color light ray or a red-color light ray by the color conversion layer 16, and is taken out.

On the other hand, not limited to the above-mentioned structure, for example, another structure may be used in which a plurality of phosphor layers 3 are formed, both of the first and second electrode are prepared as the transparent electrodes, the back electrode 4 is prepared as a black-colored electrode, or a structure for sealing the entire portion or one portion of the display device 30 by the protective layer 11 is further provided. When the light emission from the phosphor layer 3 corresponds to a white-color light ray, a structure that eliminates the necessity of the color conversion layer 16 is also available.

<Manufacturing Method>

The following description will discuss one example of a method for manufacturing a display device 30 in accordance with eleventh embodiment.

(1) First, a glass substrate is prepared as a substrate 1.

(2) Next, a back electrode 4 is formed on the substrate 1 by using a sputtering method. In this case, Pt is used as the back electrode 4, and the back electrode 4 is formed as a plurality of linear patterns that extend in a first direction in parallel with the surface of the glass substrate 1, in parallel with one another, with predetermined intervals being formed therebetween.

(3) Next, a phosphor layer 3 is formed in a solid state from the glass substrate 1 to the back electrode 4, in the same manner as in first embodiment.

(4) Next, by applying a laser annealing process only to the pixel region 3a corresponding to the pixels on the phosphor layer 3, a crystalline distribution pattern in which the pixel region 3a forms a crystalline phase while the interpixel regions 3b form amorphous phase is formed is formed within the in-plane of the phosphor layer 3.

(5) Next, Al is deposited on the phosphor layer 3 with a thickness of 200 nm as a first buffer layer 6, by using a sputtering method.

(6) Next, a transparent electrode 2 is formed on the first buffer layer 6 by a sputtering method. As the material for the transparent electrode 2, ITO is used, and the transparent electrode 2 is formed as a linear pattern having a plurality of lines that are located in parallel with the surface of the glass substrate and extend in a second direction virtually orthogonal to the aforementioned first direction, in parallel with one another with predetermined intervals between one another.

(7) Next, after film-forming SiN as a protective layer 18 on the phosphor layer 3, the first buffer layer 6 and the transparent electrode 2, a black matrix 19 is formed by a photolithography method by using a resin material containing carbon black. The black matrix 19 is disposed virtually in a lattice shape by using a plurality of linear patterns that extend in the first direction in parallel with the surface of the glass substrate 1, between gaps of the back electrodes 4, and a plurality of linear patterns that extend in the second direction between gaps of the adjacent transparent electrodes 2.

(8) Next, after forming the cover conversion layer 16 by using an inkjet method, colored patterns are formed between adjacent matrix lines of the black matrix 19 by using color resists through a photolithography method. These processes are repeatedly carried out for the respective colors of R, G and B so that a color filter 17 is formed.

(9) Next, an insulating protective layer 11 is formed on the color filter 17 by using an epoxy resin.

By using the above-mentioned processes, a top-emission-type display device 30 of the present embodiment is obtained.

Figure 34:
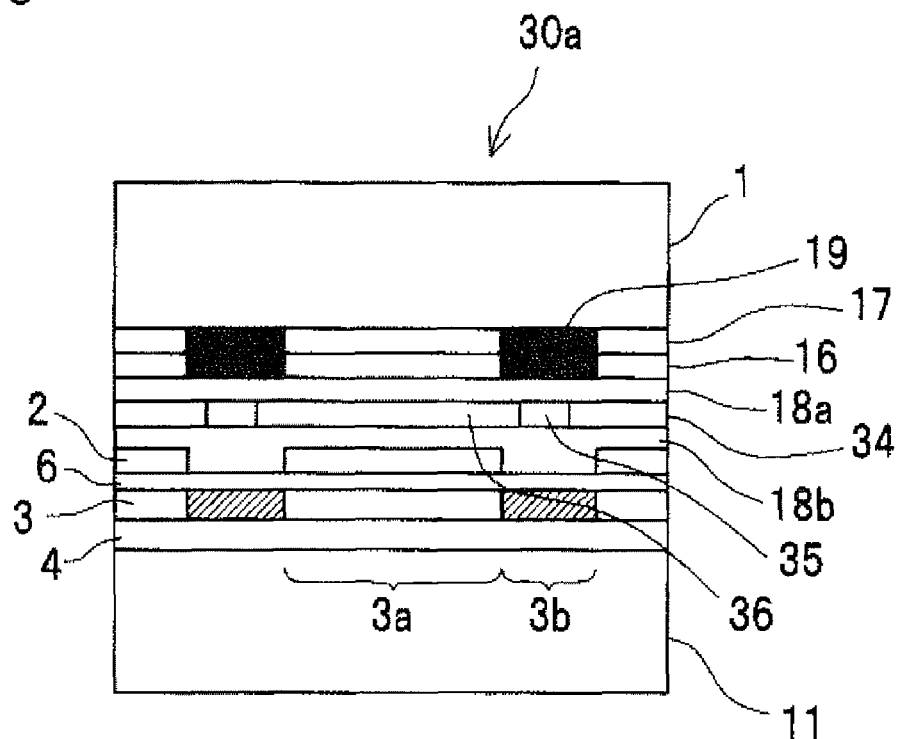
FIG. 34 is a schematic cross-sectional view that shows a structure of a modified example of a display device in accordance with ninth embodiment of the present invention.

Additionally, as shown in FIG. 34, the color filter 17, formed on the glass substrate 1, and a color conversion layer 16 are bonded to each other with an adhesive layer 34 interposed therebetween so that a top-emission-type display device 30a of another example may be manufactured. In this case, a protective layer 18b is formed on the transparent electrode 2, and a protective layer 18a is formed on the color conversion layer 16, and by forming an adhesive layer 34 on either one of the respective protective layers 18a and 18b, the protective layers may be bonded to each other. The adhesive layer 34 includes an adhesive 35 and a filler 36.

<Effects>

In the display device 30 in accordance with eleventh embodiment, over the same plane of the phosphor layer 3, the pixel region 3a is formed into a crystalline phase, while the interpixel region 3b between the adjacent pixel regions is formed into an amorphous region so that even with a display device using a low resistance phosphor layer that exhibits electroluminescent light emission, it is possible to greatly reduce crosstalk at the time of a displaying operation, and consequently to improve the display quality.

Twelfth Embodiment

<Schematic Structure of Display Device>

Figure 35:
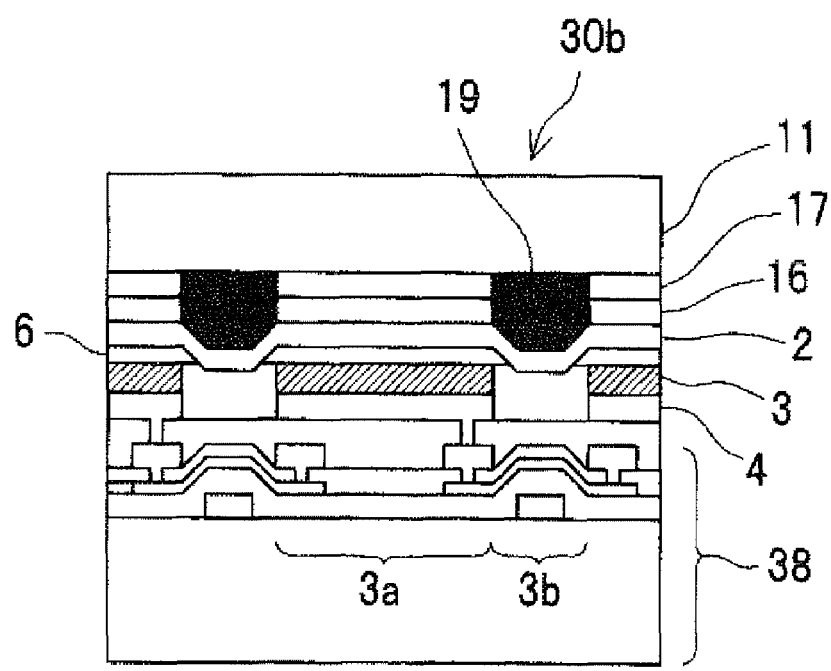
FIG. 35 is a schematic cross-sectional view that shows a structure of a display device in accordance with tenth embodiment of the present invention.
Figure 36:
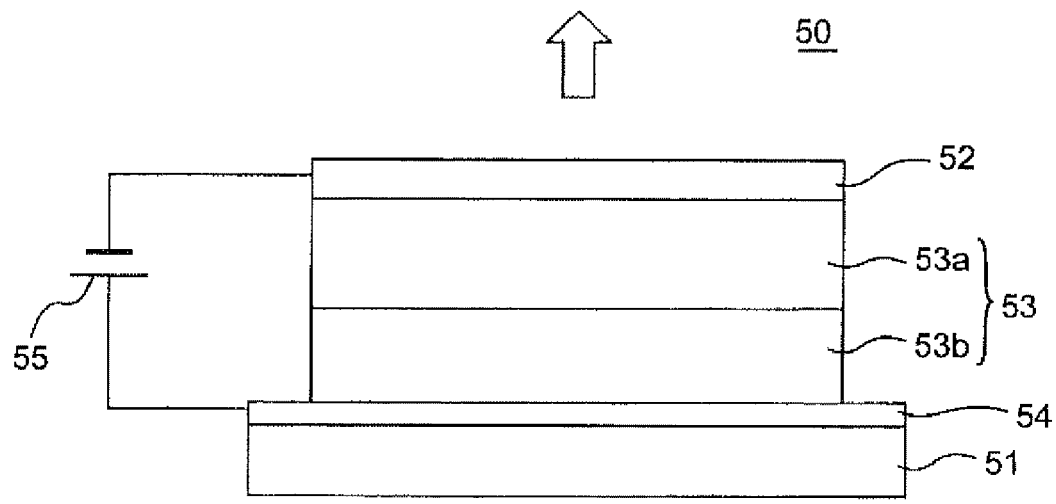
FIG. 36 is a schematic structural view that shows a light-emitting element in accordance with a conventional example.
Figure 37A:
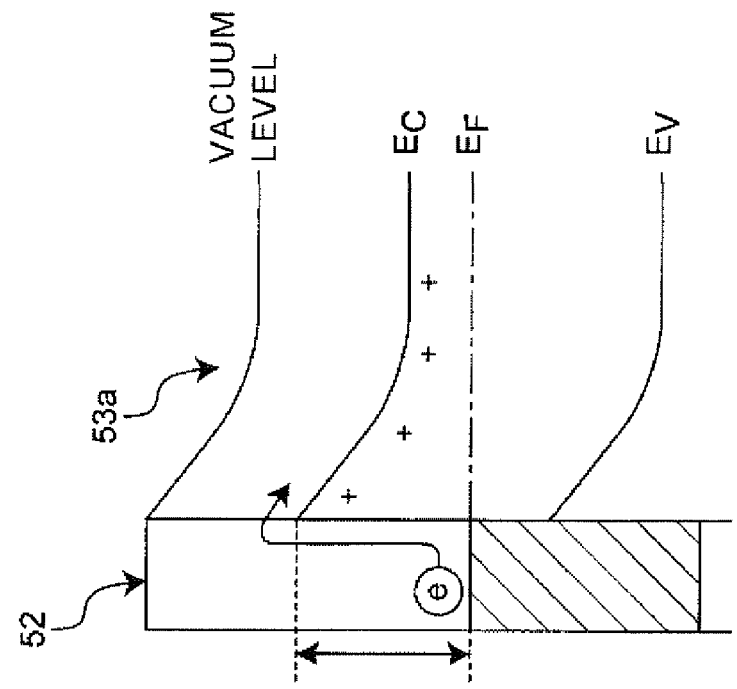
FIG. 37A is an energy band chart prior to a contact between the first electrode serving as the electron-injecting electrode and the n-type semiconductor layer.
Figure 37B:
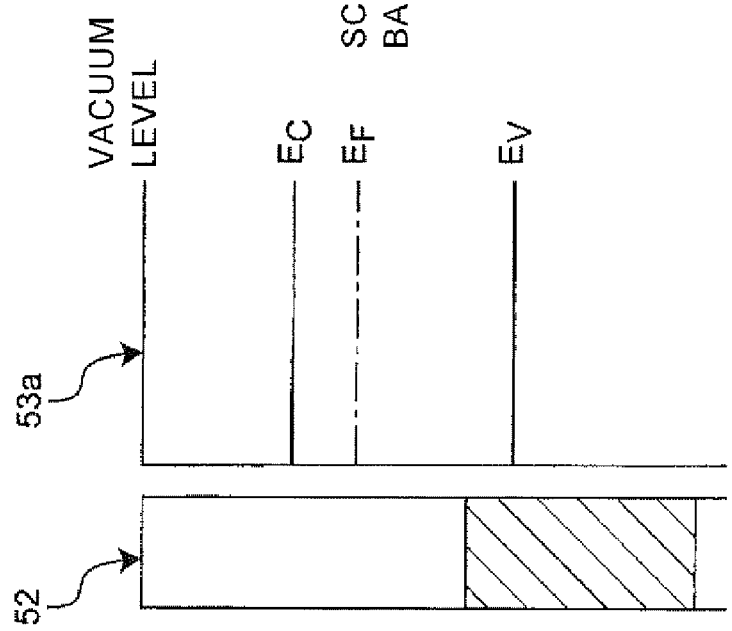
FIG. 37B is an energy band chart after the contact.
Figure 38A:
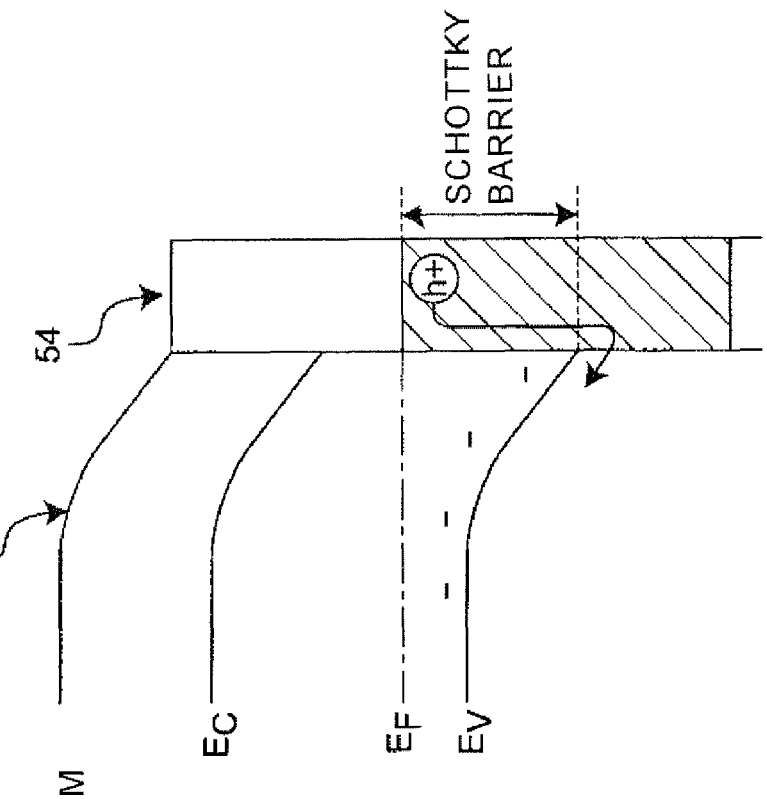
FIG. 38A is an energy band chart prior to a contact between the second electrode serving as the hole-injecting electrode and the p-type semiconductor layer.
Figure 38B:
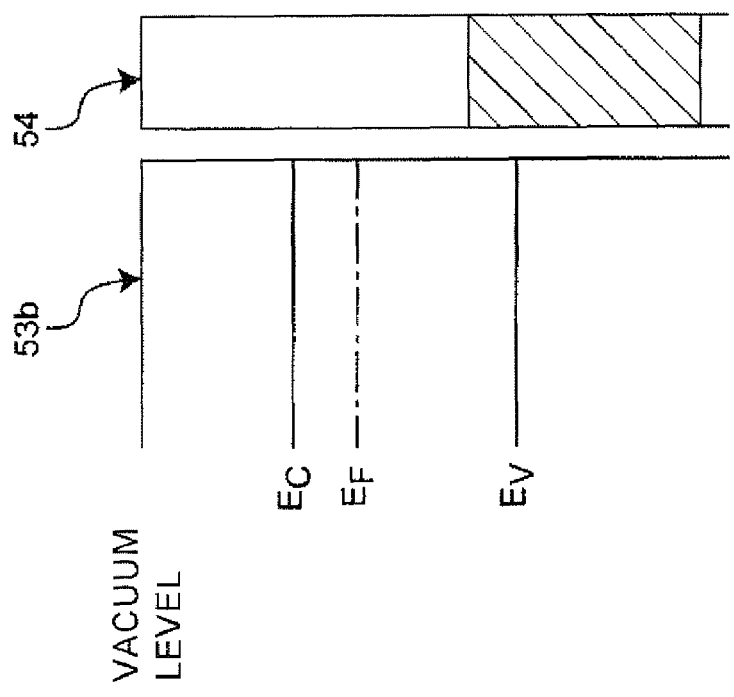
FIG. 38B is an energy band chart after the contact.

FIG. 35 is a cross-sectional view that shows a schematic structure of a display device 30b in accordance with twelfth embodiment. This display device 30b has an active-driving type display device that uses a substrate 38 (hereinafter, referred to as "TFT substrate") in which a switching thin-film transistor is installed in each of the pixels. This display device 30b is formed by successively stacking a back electrode 4, a phosphor layer 3 in a solid state, a first buffer layer 6 and a transparent electrode 2 in a solid state, each installed in each pixel, on the TFT substrate 38. This display device 30b has a top-emission-type structure in which light emission is taken out from the transparent electrode 2 side. In this structure, virtually the same members as those of the first embodiment and the same manufacturing method as that of the first embodiment may be used, except that the TFT substrate 38 is used.

In the same manner as in the display device of the first embodiment, the display device 30b makes it possible to greatly reduce crosstalk at the time of a displaying operation, and consequently to improve the display quality.

Although the present invention has been described above in detail by way of preferred embodiments thereof, the invention is not limited to the above embodiments, and various changes and modifications as would be obvious to one skilled in the art are intended to be included within the technical scope of the following claims.

The display device of the present invention, which uses a light-emitting element that can be driven at a low voltage, and has high luminance and high efficiency, makes it possible to provide a display device that can prevent crosstalk and achieve high display quality. The present invention is effectively used for providing a high-quality display device, such as a high-quality television.

This application claims priority on Japanese Patent Application No. 2007-46979 filed in Japan on Feb. 27, 2007, the entire contents of which are hereby incorporated by reference.

The invention claimed is:

1. A display device comprising:
a pair of a first electrode and a second electrode, at least one electrode of the first second electrodes being transparent or translucent;
a phosphor layer provided as being sandwiched between the first electrode and the second electrode; and
at least one buffer layer provided as being sandwiched between the first electrode or the second electrode and the phosphor layer,
wherein the phosphor layer has a plurality of pixel regions that are selectively allowed to emit light in a predetermined range thereof and non-pixel regions that divide at least one portion of the pixel regions,
wherein the buffer layer is sandwiched between the first or second electrode and the phosphor layer so that the size of an electric potential barrier between the first or second electrode and the phosphor layer via the buffer layer is made smaller than the size of a Schottky barrier between the first or second electrode and the phosphor layer that are directly made contact with each other without the buffer layer therebetween, and
wherein the pixel regions and the non-pixel regions are periodically distributed over the same plane of the phosphor layer, with the pixel regions being divided by the non-pixel regions.

2. The display device according to claim 1, wherein the non-pixel regions are provided to divide the pixel regions into a stripe shape.

3. The display device according to claim 1, wherein the non-pixel regions include discontinuous regions of the phosphor layer having the pixel regions.

4. The display device according to claim 1, wherein the non-pixel regions include one portion of the first electrode or the second electrode that divides at least one portion of the phosphor layer having the pixel regions.

5. The display device according to claim 1, wherein the non-pixel regions are made of regions having higher resistance than that of the pixel regions.

6. The display device according to claim 1, wherein the phosphor layer contains one or more elements selected from the group consisting of Ag, Cu, Ga, Mn, Al and In, and the non-pixel regions have a content density of the element that is different from that of the pixel regions.

7. The display device according to claim 1, wherein the non-pixel regions are formed by amorphous phase.

8. The display device according to claim 1, wherein the pixel regions are formed by crystalline phase of the material of the phosphor layer, and the non-pixel regions are formed by amorphous phase of the material of the phosphor layer.

9. The display device according to claim 1, wherein a DC voltage is applied between the first electrode and the second electrode so as to emit light, and either one of the first electrode and the second electrode functions as an electron-injecting electrode, while the other electrode functions as a hole-injecting electrode, and
   wherein the buffer layer is provided with at least one of buffer layers including:
   a first buffer layer formed between the electron-injecting electrode and the phosphor layer, and
   a second buffer layer formed between the hole-injecting electrode and the phosphor layer.

10. The display device according to claim 1, wherein the phosphor layer is a two-layer-type phosphor layer in which an n-type semiconductor layer and a p-type semiconductor layer are stacked.

11. The display device according to claim 1, wherein the phosphor layer is a three-layer-type phosphor layer including an n-type semiconductor layer and a p-type semiconductor layer with a non-dope semiconductor layer being sandwiched therebetween.

12. The display device according to claim 1, further comprising:
   a color conversion layer provided as being parallel to the first electrode and the second electrode, and the color conversion layer placed in front the phosphor layer in a light emission taking-out direction.

13. The display device according to claim 1, further comprising:
   a supporting substrate that faces at least one of the electrodes and supports the electrodes.

* * * * *